United States Patent
Hanaoka

(10) Patent No.: US 9,698,271 B2
(45) Date of Patent: Jul. 4, 2017

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventor: Kazuya Hanaoka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/144,274

(22) Filed: May 2, 2016

(65) Prior Publication Data

US 2016/0247934 A1 Aug. 25, 2016

Related U.S. Application Data

(63) Continuation of application No. 14/272,767, filed on May 8, 2014, now Pat. No. 9,337,344.

(30) Foreign Application Priority Data

May 9, 2013 (JP) ................................. 2013-099534

(51) Int. Cl.
*H01L 29/786* (2006.01)
*H01L 29/417* (2006.01)
(Continued)

(52) U.S. Cl.
CPC ...... *H01L 29/78606* (2013.01); *H01L 27/124* (2013.01); *H01L 29/045* (2013.01);
(Continued)

(58) Field of Classification Search
CPC ........... H01L 29/66757; H01L 29/7869; H01L 29/41733
See application file for complete search history.

(56) References Cited

U.S. PATENT DOCUMENTS 5,075,746 A 12/1991 Hayashi et al.
5,731,856 A 3/1998 Kim et al.
(Continued)

FOREIGN PATENT DOCUMENTS

EP 1 737 044 A1 12/2006
EP 2 226 847 A1 9/2010
(Continued)

OTHER PUBLICATIONS

Fortunato, E.M.C. et al., "Wide-Bandgap High-Mobility ZnO Thin-Film Transistors Produced at Room Temperature", Applied Physics Letters, Sep. 27, 2004, vol. 85, No. 13, pp. 2541-2543.
(Continued)

*Primary Examiner* — Victor A Mandala
*Assistant Examiner* — Regan J Rundio
(74) *Attorney, Agent, or Firm* — Husch Blackwell LLP

(57) ABSTRACT

To provide a semiconductor device having a structure with which the device can be easily manufactured even if the size is decreased and which can suppress a decrease in electrical characteristics caused by the decrease in the size, and a manufacturing method thereof. A source electrode layer and a drain electrode layer are formed on an upper surface of an oxide semiconductor layer. A side surface of the oxide semiconductor layer and a side surface of the source electrode layer are provided on the same surface and are electrically connected to a first wiring. Further, a side surface of the oxide semiconductor layer and a side surface of the drain electrode layer are provided on the same surface and are electrically connected to a second wiring.

9 Claims, 17 Drawing Sheets

(51) Int. Cl.
- *H01L 21/768* (2006.01)
- *H01L 29/26* (2006.01)
- *H01L 21/336* (2006.01)
- *H01L 29/66* (2006.01)
- *H01L 27/12* (2006.01)
- *H01L 29/45* (2006.01)
- *H01L 29/04* (2006.01)
- *H01L 29/24* (2006.01)

(52) U.S. Cl.
CPC ........ *H01L 29/24* (2013.01); *H01L 29/41733* (2013.01); *H01L 29/66969* (2013.01); *H01L 29/7869* (2013.01); *H01L 29/78618* (2013.01); *H01L 29/78696* (2013.01); *H01L 29/458* (2013.01)

(56) References Cited

U.S. PATENT DOCUMENTS

| | | |
|---|---|---|
| 5,744,864 A | 4/1998 | Cillessen et al. |
| 5,863,833 A | 1/1999 | Shin |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,909,132 B2 | 6/2005 | Yoshihara et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 * | 5/2007 | Shih .................. H01L 29/78633 257/13 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,755,739 B2 | 7/2010 | Lee et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,343,800 B2 | 1/2013 | Umeda et al. |
| 8,502,221 B2 | 8/2013 | Yamazaki |
| 8,530,285 B2 | 9/2013 | Yamazaki et al. |
| 8,541,258 B2 | 9/2013 | Kim et al. |
| 8,686,425 B2 | 4/2014 | Yamazaki et al. |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237875 A1 | 10/2008 | Yamazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2010/0320458 A1 | 12/2010 | Umeda et al. |
| 2011/0140100 A1 * | 6/2011 | Takata ................ H01L 29/7869 257/43 |
| 2011/0215328 A1 | 9/2011 | Morosawa et al. |
| 2011/0240991 A1 | 10/2011 | Yamazaki |
| 2011/0284837 A1 * | 11/2011 | Nishijima ......... H01L 29/41733 257/43 |
| 2012/0119205 A1 | 5/2012 | Taniguchi et al. |
| 2012/0146713 A1 | 6/2012 | Kim et al. |
| 2013/0032795 A1 | 2/2013 | Yamazaki |
| 2013/0140569 A1 | 6/2013 | Yoneda et al. |
| 2013/0161606 A1 | 6/2013 | Isobe et al. |
| 2013/0313550 A1 | 11/2013 | Yamazaki |
| 2013/0320330 A1 | 12/2013 | Yamazaki |
| 2013/0320334 A1 | 12/2013 | Yamazaki et al. |

(56) References Cited

U.S. PATENT DOCUMENTS

| | | |
|---|---|---|
| 2014/0209896 A1 | 7/2014 | Yamazaki |
| 2014/0326992 A1 | 11/2014 | Hondo et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-231613 A | 10/2009 |
| JP | 2010-016347 A | 1/2010 |
| JP | 4415062 B1 | 2/2010 |
| JP | 2010-067954 A | 3/2010 |
| JP | 2010-177431 A | 8/2010 |
| JP | 4571221 B1 | 10/2010 |
| JP | 2011-124360 A | 6/2011 |
| JP | 2011-253898 A | 12/2011 |
| JP | 2012-155076 A | 8/2012 |
| JP | 2012-160679 A | 8/2012 |
| JP | 2013-055329 A | 3/2013 |
| KR | 2012-0065048 A | 6/2012 |
| KR | 2013-0016092 A | 2/2013 |
| TW | 201314914 | 4/2013 |
| WO | WO 2004/114391 A1 | 12/2004 |
| WO | WO 2008/133345 A1 | 11/2008 |

OTHER PUBLICATIONS

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins, M. et al., "A Ferroelectric Transparent Thin-Film Transistor," Applied Physics Letters, Jun. 17, 1996, vol. 68, No. 25, pp. 3650-3652.

Nakamura, M. et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka, N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura, K. et al., "Thin-Film Transistor Fabricated in Single-Crystalline Transparent Oxide Semiconductor," Science, May 23, 2003, vol. 300, No. 5623, pp. 1269-1272.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Nomura, K. et al., "Carrier Transport in Transparent Oxide Semiconductor with Intrinsic Structural Randomness Probed Using Single-Crystalline $InGaO_3(ZnO)_5$ Films," Applied Physics Letters, Sep. 13, 2004, vol. 85, No. 11, pp. 1993-1995.

Li, C. et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son, K-S. et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari, H. et al., "60.2: Intermediate Connector With Suppressed Voltage Loss for White Tandem OLEDS," SID Digest '09: SID Intaernational Symposium Digest of Technical Papers, May 31, 2009, vol. 40, pp. 899-902.

Kanno, H. et al., "White Stacked Electrophosphorecent Organic Light-Emitting Devices Employing $MOO_3$ as a Charge-Generation Layer," Advanced Materials, 2006, vol. 18, No. 3, pp. 339-342.

Tsuda, K. et al., "Ultra Low Power Consumption Technologies for Mobile TFT-LCDs," IDW '02: Proceedings of the 9th International Display Workshops, Dec. 4, 2002, pp. 295-298.

Van de Walle, C.G., "Hydrogen as a Cause of Doping in Zinc Oxide," Physical Review Letters, Jul. 31, 2000, vol. 85, No. 5, pp. 1012-1015.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circuits, 2008, vol. 43, No. 1, pp. 292-299.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., "Optical Studies of the Amorphous Liquid-Cholesteric Liquid Crystal Transition: The 'Blue Phase'," Physics Letters, Sep. 10, 1973, vol. 45A, No. 2, pp. 115-116.

(56) References Cited

OTHER PUBLICATIONS

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S-H. et al., "Challenge to Future Displays: Transparent AM-OLED Driven by PEALD Grown ZnO TFT," IMID '07 Digest, 2007, pp. 1249-1252.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Godo, H et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara, H et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Miyasaka, M., "SUFTLA Flexible Microelectronics on Their Way to Business," SID Digest '07: SID International Symposium Digest of Technical Papers, 2007, vol. 38, pp. 1673-1676.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Lee, H.N. et al., "Current Status of, Challenges to, and Perspective View of AM-OLED," IDW '06: Proceedings of the 13th International Display Workshops, Dec. 7, 2006, pp. 663-666.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, M., "Synthesis of Homologous Compound with New Long-Period Structure," Nirim Newsletter, Mar. 1, 1995, vol. 150, pp. 1-4.

Kikuchi, H. et al., "Polymer-Stabilized Liquid Crystal Blue Phases," Nature Materials, Sep. 2, 2002, vol. 1, pp. 64-68.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.

Kitzerow, H-S. et al., "Observation of Blue Phases in Chiral Networks," Liquid Crystals, 1993, vol. 14, No. 3, pp. 911-916.

Costello, M.J. et al., "Electron Microscopy of a Cholesteric Liquid Crystal and Its Blue Phase," Physical Review. A, May 1, 1984, vol. 29, No. 5, pp. 2957-2959.

Meiboom, S. et al., "Theory of the Blue Phase of Cholesteric Liquid Crystals," Physical Review Letters, May 4, 1981, vol. 46, No. 18, pp. 1216-1219.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita, M. et al., "Mechanism of Electrical Conductivity of Transparent InGaZnO4," Physical Review. B, Jan. 15, 2000, vol. 61, No. 3, pp. 1811-1816.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Janotti, A. et al., "Oxygen Vacancies in ZnO," Applied Physics Letters, 2005, vol. 87, pp. 122102-1-122102-3.

Oba, F. et al., "Defect Energetics in ZnO: A Hybrid Hartree-Fock Density Functional Study," Physical Review. B, 2008, vol. 77, pp. 245202-1-245202-6.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Kim, S. et al., "High-Performance Oxide Thin Film Transistors Passivated by Various Gas Plasmas," 214th ECS Meeting, 2008, No. 2317, ECS.

Clark, S.J. et al., "First Principles Methods Using CASTEP," Zeitschrift fur Kristallographie, 2005, vol. 220, pp. 567-570.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Nakayama, M. et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(56) References Cited

OTHER PUBLICATIONS

International Search Report re Application No. PCT/JP2014/062214, dated Jul. 29, 2014.
Written Opinion re Application No. PCT/JP2014/062214, dated Jul. 29, 2014.

* cited by examiner

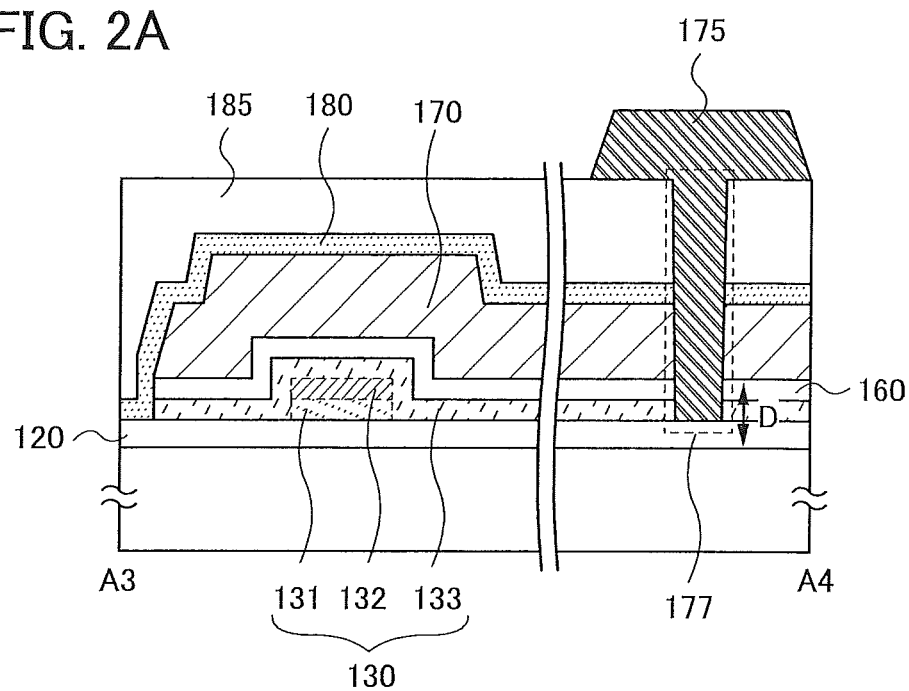
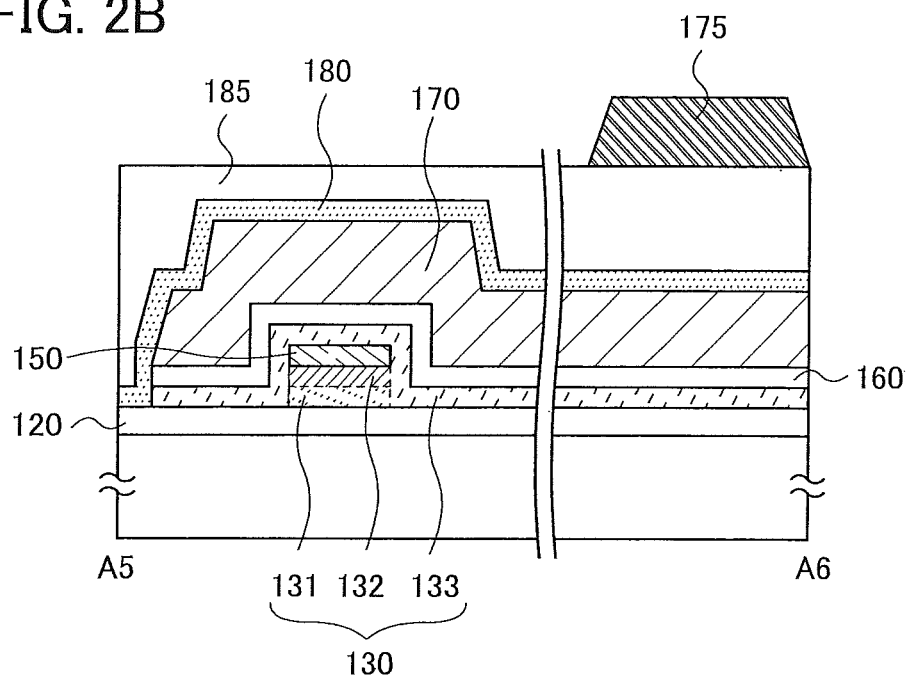

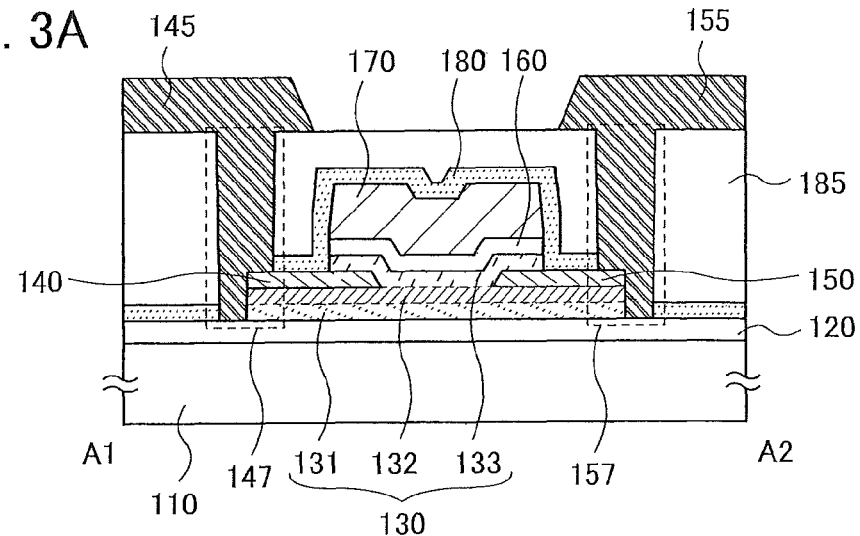
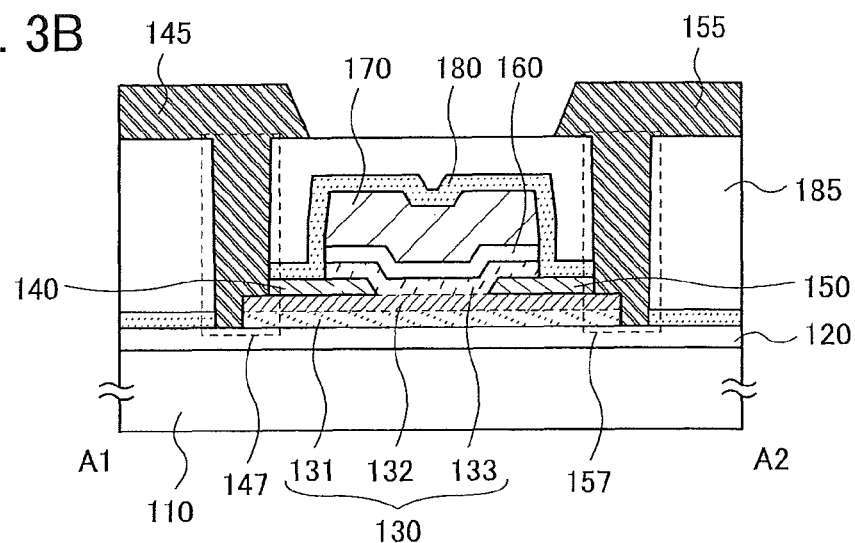
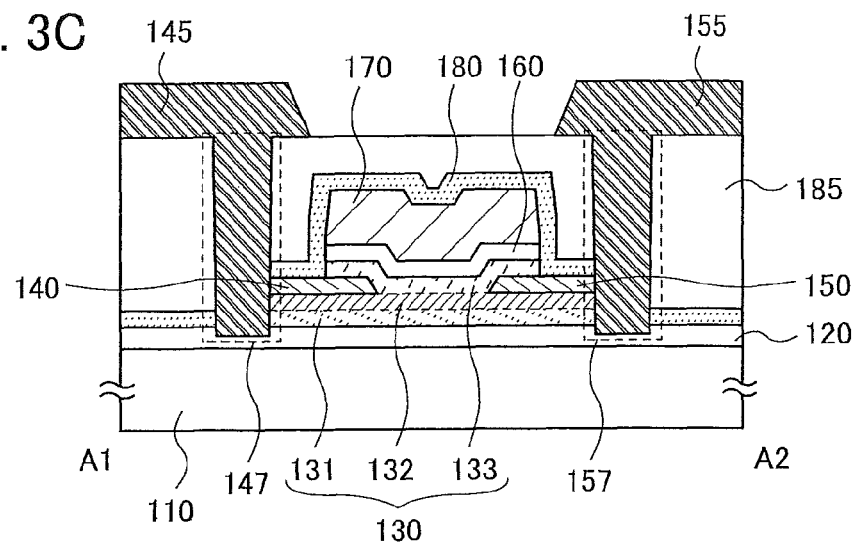

SEMICONDUCTOR DEVICE AND MANUFACTURING METHOD THEREOF

This application is a continuation of copending U.S. application Ser. No. 14/272,767, filed on May 8, 2016 which is incorporated herein by reference.

TECHNICAL FIELD

The present invention relates to an object, a method, or a manufacturing method. The present invention relates to a process, a machine, manufacture, or a composition of matter. In particular, one embodiment of the present invention relates to a semiconductor device, a display device, a light-emitting device, a storage device, an arithmetic unit, an imaging device, a method for driving any of them, or a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, or an electronic device includes a semiconductor device.

BACKGROUND ART

Attention has been focused on a technique for forming a transistor using a semiconductor thin film formed over a substrate having an insulating surface (also referred to as a thin film transistor (TFT)). The transistor is used in a wide range of electronic devices such as an integrated circuit (IC) and an image display device (display device). A silicon-based semiconductor material is widely known as a material for a semiconductor thin film applicable to a transistor. As another example, an oxide semiconductor has attracted attention.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

DISCLOSURE OF INVENTION

A high density of an integrated circuit requires miniaturization of a transistor, and a transistor having a simple structure and a simple manufacturing method of a transistor are required because the miniaturization increases the degree of difficulty of a manufacturing process.

In addition, it is known that miniaturization of a transistor is likely to cause deterioration of or variation in electrical characteristics of the transistor. In other words, miniaturization of a transistor is likely to cause a decrease in yield of an integrated circuit.

Thus, one object of one embodiment of the present invention is to provide a semiconductor device having a structure with which the device can be manufactured through a simple process even in the case of miniaturization. Another object is to provide a semiconductor device having a structure with which a decrease in a yield due to miniaturization can be suppressed. Another object of one embodiment of the present invention is to provide a semiconductor device in which deterioration of electrical characteristics which becomes more noticeable as the transistor is miniaturized can be suppressed. Another object is to provide a semiconductor device having a high degree of integration. Another object is to provide a semiconductor device in which deterioration of electrical characteristics is reduced. Another object is to provide a semiconductor device in which variation in electrical characteristics is reduced. Another object is to provide a semiconductor device with low power consumption. Another object is to provide a semiconductor device with high reliability. Another object is to provide a semiconductor device which can retain data even when power supply is stopped. Another object is to provide a method for manufacturing the semiconductor device.

Note that the descriptions of these objects do not disturb the existence of other objects. Note that in one embodiment of the present invention, there is no need to achieve all the objects. Other objects are apparent from and can be derived from the description of the specification, the drawings, the claims, and the like.

One embodiment of the present invention relates to a semiconductor device in which a source electrode layer or a drain electrode layer is formed on an upper surface of an oxide semiconductor layer.

Note that "side contact" in this specification means a state where a side surface of one element is in contact with part of the other element, so that electrical connection between the one element and the other element is obtained.

One embodiment of the present invention is a semiconductor device including a first oxide semiconductor layer over an insulating surface; a second oxide semiconductor layer over the first oxide semiconductor layer; a source electrode layer and a drain electrode layer which are over the second oxide semiconductor layer and whose side surfaces are provided on the same surface as side surfaces of the second oxide semiconductor layer; a third oxide semiconductor layer which is over the second oxide semiconductor layer and partly in contact with each of the source electrode layer and the drain electrode layer; a gate insulating film over the third oxide semiconductor layer; a gate electrode layer over the gate insulating film; and an insulating layer over the insulating surface, the source electrode layer, the drain electrode layer, and the gate electrode layer. In the insulating layer, a first opening where part of the second oxide semiconductor layer and part of the source electrode layer are exposed, a second opening where part of the second oxide semiconductor layer and part of the drain electrode layer are exposed, and a third opening where part of the gate electrode layer is exposed are formed. The second oxide semiconductor layer and the source electrode layer are electrically connected to a first wiring in the first opening. The second oxide semiconductor layer and the drain electrode layer are electrically connected to a second wiring in the second opening. The gate electrode layer is electrically connected to a third wiring in the third opening.

Note that in this specification and the like, ordinal numbers such as "first" and "second" are used in order to avoid confusion among components and do not limit the components numerically.

Further, a conduction band minimum of the first oxide semiconductor layer and a conduction band minimum of the third oxide semiconductor layer are preferably closer to a vacuum level than a conduction band minimum of the second oxide semiconductor layer by 0.05 eV or more and 2 eV or less.

It is preferable that the first oxide semiconductor layer, the second oxide semiconductor layer, and the third oxide semiconductor layer each include an In-M-Zn oxide (M is Al, Ti, Ga, Y, Zr, La, Ce, Nd, or Hf), and that an atomic ratio of M to In in each of the first oxide semiconductor layer and the third oxide semiconductor layer be higher than an atomic ratio of M to In in the second oxide semiconductor layer.

Each of the first oxide semiconductor layer, the second oxide semiconductor layer, and the third oxide semiconductor layer preferably includes a crystal in which c-axes are aligned.

Further, the source electrode layer and the drain electrode layer are each preferably formed of a single layer of Al, Cr, Cu, Ta, Ti, Mo, or W, a stacked film of any of these, or an alloy material containing any of these as its main component.

Another embodiment of the present invention is a method for manufacturing a semiconductor device comprising the steps of: forming a stacked film of a first oxide semiconductor film and a second oxide semiconductor film over an insulating surface; forming a first conductive film over the stacked film; forming a first resist mask over the first conductive film; selectively etching the first conductive film using the first resist mask as a mask to form a first conductive layer; selectively etching the stacked film using the first conductive layer as a mask and selectively etching the first conductive layer to divide the first conductive layer, thereby forming a stack of a first oxide semiconductor layer and a second oxide semiconductor layer and a source electrode layer and a drain electrode layer over the stack; forming a third oxide semiconductor film over the insulating surface, the stack, the source electrode layer, and the drain electrode layer; forming an oxide insulating film over the third oxide semiconductor film; forming a second conductive film over the oxide insulating film; forming a second resist mask over the second conductive film; selectively etching the second conductive film using the second resist mask as a mask to form a gate electrode layer; selectively etching the oxide insulating film and the third oxide semiconductor film using the gate electrode layer as a mask to form a gate insulating film and a third oxide semiconductor layer; forming an insulating layer over the insulating surface, the source electrode layer, the drain electrode layer, and the gate electrode layer; forming, in the insulating layer, a first opening where part of the second oxide semiconductor layer and part of the source electrode layer are exposed, a second opening where part of the second oxide semiconductor layer and part of the drain electrode layer are exposed, and a third opening where part of the gate electrode layer is exposed; and forming a first wiring electrically connected to the second oxide semiconductor layer and the source electrode layer in the first opening, a second wiring electrically connected to the second oxide semiconductor layer and the drain electrode layer in the second opening, and a third wiring electrically connected to the gate electrode layer in the third opening.

Further, the first oxide semiconductor layer and the third oxide semiconductor layer are each preferably formed using a material in which a conduction band minimum of the first oxide semiconductor layer and a conduction band minimum of the third oxide semiconductor layer are closer to a vacuum level than a conduction band minimum of the second oxide semiconductor layer is by 0.05 eV or more and 2 eV or less.

The first oxide semiconductor layer, the second oxide semiconductor layer, and the third oxide semiconductor layer are each preferably formed using an In-M-Zn oxide (M is Al, Ti, Ga, Y, Zr, La, Ce, Nd, or Hf), and that an atomic ratio of M to In in each of the first oxide semiconductor layer and the third oxide semiconductor layer be higher than an atomic ratio of M to In in the second oxide semiconductor layer.

For each of the first oxide semiconductor layer, the second oxide semiconductor layer, and the third oxide semiconductor layer, a material including a crystal in which c-axes are aligned is preferably used.

In the above structure, it is preferable that the source electrode layer and the drain electrode layer be each formed using a single layer of Al, Cr, Cu, Ta, Ti, Mo, or W, a stacked layer of any of these, or an alloy material containing any of these as its main component.

According to one embodiment of the present invention, a semiconductor device having a structure with which the device can be manufactured in a simple process even when the device is miniaturized can be provided. Alternatively, a semiconductor device having a structure which can prevent a decrease in yield caused by miniaturization can be provided. Alternatively, a semiconductor device in which a deterioration in electrical characteristics which becomes more noticeable as the transistor is miniaturized can be suppressed can be provided. Alternatively, a highly integrated semiconductor device can be provided. Alternatively, a semiconductor device in which deterioration in electrical characteristics is reduced can be provided. Alternatively, a semiconductor device in which variation in electrical characteristics is suppressed can be provided. Alternatively, a semiconductor device with low power consumption can be provided. Alternatively, a highly reliable semiconductor device can be provided. Alternatively, a semiconductor device in which data is retained even when not powered can be provided. Alternatively, a method for manufacturing the above semiconductor device can be provided.

Note that the descriptions of these effects do not disturb the existence of other effects. In one embodiment of the present invention, there is no need to obtain all the effects. Other effects are apparent from and can be derived from the description of the specification, the drawings, the claims, and the like.

BRIEF DESCRIPTION OF DRAWINGS

In the accompanying drawings:

FIGS. 2A and 2B are cross-sectional views of a transistor;

FIGS. 3A to 3C are cross-sectional views of transistors;

BEST MODE FOR CARRYING OUT THE INVENTION

Figure 1A:
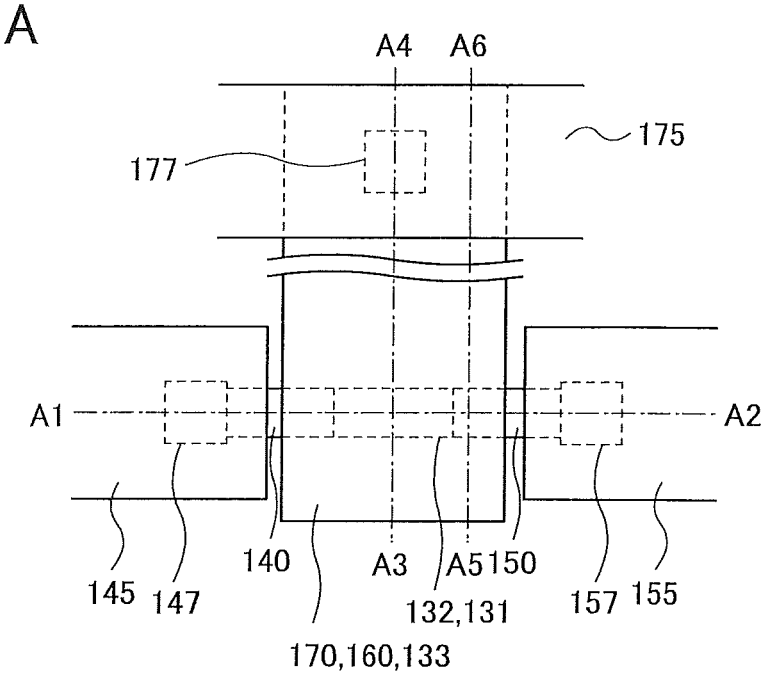
FIGS. 1A and 1B are a top view and a cross-sectional view of a transistor.

Embodiments are described in detail with reference to the drawings. Note that the present invention is not limited to the following description and it is readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, a connection relation other than connection relations shown in the drawings and texts is also included, without being limited to a predetermined connection relation, for example, a connection relation shown in the drawings and texts.

In the case where X and Y are electrically connected, one or more elements (e.g., a switch, a transistor, a capacitor, an inductor, a resistor, a diode, a display element, a light-emitting element, and a load) that enable an electrical connection between X and Y can be connected between X and Y, for example. Note that the switch is controlled to be turned on or off. That is, the switch has a function of determining whether current flows or not by being turned on or off (becoming an on state and an off state). Alternatively, the switch has a function of selecting and changing a current path.

In the case where X and Y are functionally connected, one or more circuits (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and a control circuit) that enable a functional connection between X and Y can be connected between X and Y, for example. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, an "electrical connection" in this specification includes in its category such a case where one conductive film has functions of a plurality of components.

Note that in this specification and the like, a transistor can be formed using any of a variety of substrates. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film include attachment films formed using polypropylene, polyester, polyvinyl fluoride, polyvinyl chloride, and the like. Examples of a base film include a base film formed using polyester, polyamide, polyimide, an inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such a transistor, power consumption of the circuit can be reduced or the circuit can be highly integrated.

Note that a transistor may be formed using one substrate, and then, the transistor may be transferred to another substrate. Examples of a substrate to which a transistor is transferred include, in addition to the above-described substrates over which transistors can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thinning can be achieved.

Embodiment 1

In this embodiment, a semiconductor device of one embodiment of the present invention is described with reference to drawings.

Figure 1B:
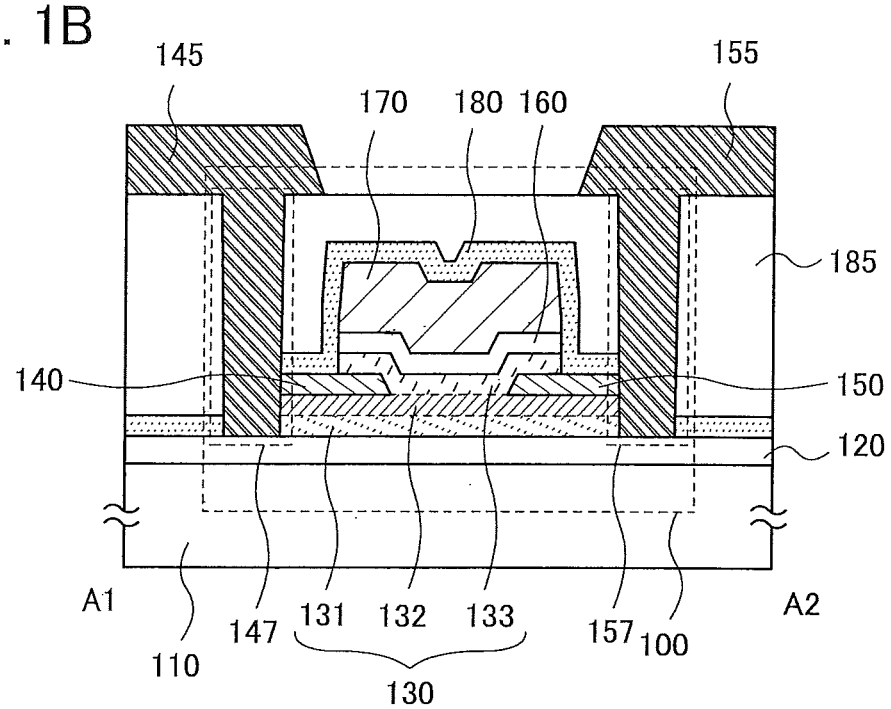

FIGS. 1A and 1B are a top view and a cross-sectional view of a transistor of one embodiment of the present invention. FIG. 1A is the top view. FIG. 1B illustrates a cross section taken along dashed-dotted line A1-A2 in. FIG. 1A. FIG. 2A is a cross-sectional view taken along dashed-dotted line A3-A4 in FIG. 1A. FIG. 2B is a cross-sectional view taken along dashed-dotted line A5-A6 in FIG. 1A. Note that for simplification of the drawing, some components are not illustrated in the top view in FIG. 1A. In some cases, the direction of the dashed-dotted line A1-A2 is referred to as a channel length direction, and the direction of the dashed-dotted line A3-A4 is referred to as a channel width direction.

A transistor 100 illustrated in FIGS. 1A and 1B and FIGS. 2A and 2B includes a base insulating film 120 over a substrate 110, a stack in which a first oxide semiconductor layer 131 and a second oxide semiconductor layer 132 are formed in this order and which is over the base insulating film, a source electrode layer 140 and a drain electrode layer 150 over the second oxide semiconductor layer, a third oxide semiconductor layer 133 which is formed in contact with the base insulating film 120 and the stack and is partly in contact with each of the source electrode layer 140 and the drain electrode layer 150, a gate insulating film 160 over the third oxide semiconductor layer, a gate electrode layer 170 over the gate insulating film, and an insulating layer 180 over the base insulating film 120, the source electrode layer 140, the drain electrode layer 150, and the gate electrode layer 170.

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

An insulating layer 185 formed of an oxide may be formed over the insulating layer 180. Note that the insulating layer 185 may be provided as needed and another insulating layer may be further provided thereover. The first oxide semiconductor layer 131, the second oxide semiconductor layer 132, and the third oxide semiconductor layer 133 are collectively referred to as an oxide semiconductor layer 130.

In the insulating layer 180, a first opening 147 where the second oxide semiconductor layer 132 and the source electrode layer 140 are partly exposed is formed. Further, a second opening 157 where the second oxide semiconductor layer 132 and the drain electrode layer 150 are partly exposed is formed. Furthermore, a third opening 177 where the gate electrode layer 170 is partly exposed is formed.

In the first opening 147, a side surface of the second oxide semiconductor layer 132 and a side surface of the source electrode layer 140 are provided on the same surface and are electrically connected to a first wiring 145. In the second opening 157, a side surface of the second oxide semiconductor layer 132 and a side surface of the drain electrode layer 150 are provided on the same surface and are electrically connected to a second wiring 155. In the third opening 177, the gate electrode layer 170 is electrically connected to a third wiring 175 by side contact.

Conventionally, electrical connection has been obtained by providing an opening in an insulating layer and the like formed on an electrode layer so that part of a wiring formed in the opening is in contact with part of the upper surface of the electrode layer.

However, as miniaturization of the transistor progresses, the degree of difficulty in manufacturing increases, which results in a defect in the opening provided in the insulating layer or the like, variation in the depth of the opening, and the like. Thus, contact resistance between the electrode layer and the wiring is likely to vary among elements. In other words, an increase in the degree of difficulty in manufacturing a miniaturized transistor is one factor of variation in the electrical characteristics of transistors.

On the other hand, in one embodiment of the present invention, part of an electrode layer exposed in an opening and part of a wiring formed in the opening are electrically connected to each other by side contact. Thus, variation in contact area between the electrode layer and the wiring can be less likely to occur. In other words, variation in contact resistance between the electrode layer and the wiring in elements can be suppressed, which enables reduction in variation in the electrical characteristics of a transistor which is caused by the variation.

Further, in the case where an opening is provided in an insulating layer to expose an electrode layer and the like, over-etching an electrode layer and the like to expose side surfaces of the electrode layer and the like in the opening is less difficult than exposing upper surfaces of the electrode layer and the like by controlling etching conditions strictly. In the case where an opening is formed so as to extend into the electrode layer, for example, the etching conditions can be freely selected even when the etching rate of the electrode layer is sufficiently lower than that of the insulating layer. Accordingly, the yield of the transistor can be improved.

In one embodiment of the present invention, it is preferable to employ a structure in which the first opening 147 and the second opening 157 reach the base insulating film 120 as illustrated in FIG. 1B. The structure can be formed under etching conditions having a high degree of freedom and can reduce variation in electrical characteristics of a transistor and improve yield. Moreover, since a wiring in contact with a semiconductor layer functions as part of an electrode layer, contact resistance between the electrode layer and the semiconductor layer can be further reduced.

Further, when the gate electrode layer 170 is connected to the third wiring 175 by side contact as illustrated in FIGS. 2A and 2B, variation in contact area between the electrode layer and the wiring can be less likely to occur and variation in contact resistance can be suppressed. Note that the bottom of the third opening 177 is positioned in a range D (in any of the gate insulating film 160, the third oxide semiconductor layer 133, and the base insulating film 120) in the drawing.

Note that the structures inside the first opening 147 and the second opening 157 are not limited to the example illustrated in FIG. 1B. For example, as illustrated in FIG. 3A, a structure may be employed in which upper surfaces of the source electrode layer 140 and the drain electrode layer 150 are partly exposed in the first opening 147 and the second opening 157. When the etching rates of the source electrode layer 140 and the drain electrode layer 150 are sufficiently lower than that of the insulating layer 180, the structure can be formed easily.

Alternatively, as illustrated in FIG. 3B, a structure may be employed in which an upper surface of the second oxide semiconductor layer 132 is partly exposed in the first opening 147 and the second opening 157. Further alternatively, although not illustrated, a structure may be employed in which an upper surface of the first oxide semiconductor layer 131 is partly exposed in the openings. When the etching rate of the second oxide semiconductor layer 132 and/or the etching rate of the first oxide semiconductor layer 131 are/is sufficiently lower than that of the insulating layer 180, the structure can be formed easily.

Note that in the description of FIGS. 3A and 3B, a layer whose upper surface is partly exposed may be partly etched in the film thickness direction.

Still further alternatively, as illustrated in FIG. 3C, the bottoms of the first opening 147 and the second opening 157 may be positioned in the base insulating film 120. When the etching rate of the insulating layer 180 is close to the etching rate of each of the source electrode layer 140, the drain electrode layer 150, the second oxide semiconductor layer 132, the first oxide semiconductor layer 131, and the base insulating film 120, the structure can be formed easily.

Figure 14A:
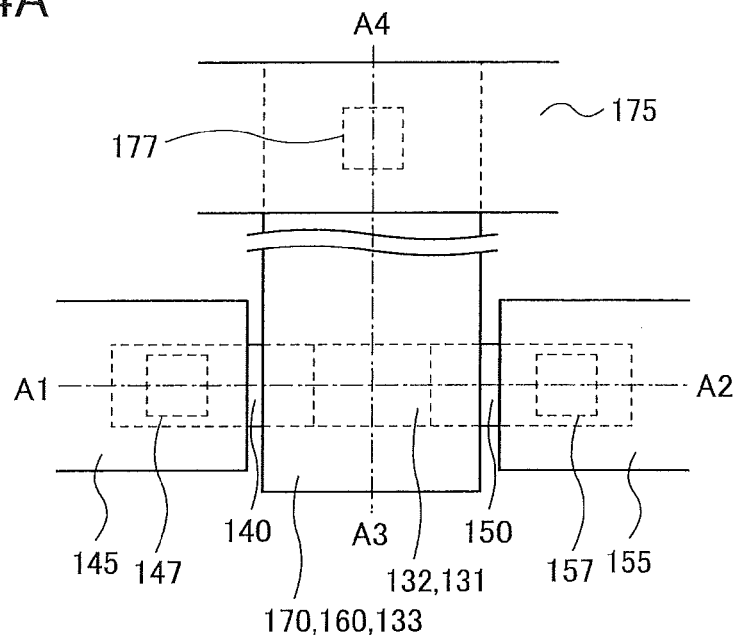
FIGS. 14A and 14B are a top view and a cross-sectional view of a transistor.
Figure 14B:
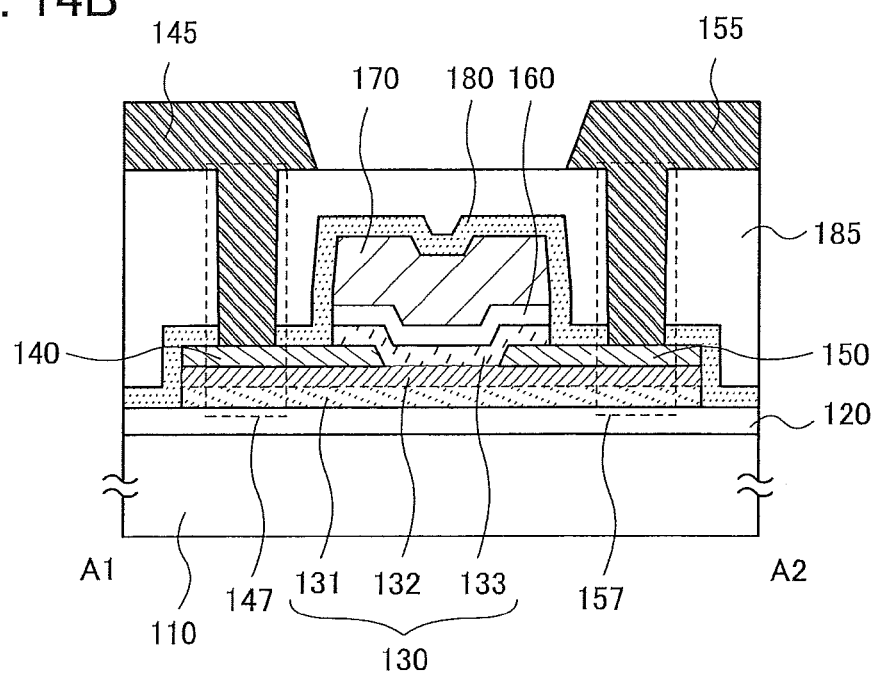

Note that when the etching conditions can be controlled strictly, as illustrated in FIGS. 14A and 14B, a structure may be employed in which upper surfaces of the source electrode layer 140 and the drain electrode layer 150 are partly exposed to be in contact with the first wiring 145 and the second wiring 155.

Figure 15A:
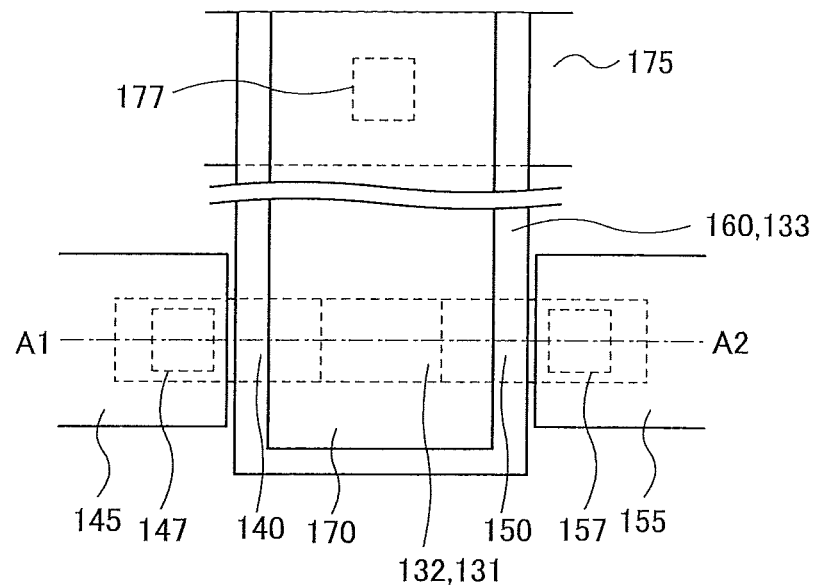
FIGS. 15A and 15B are a top view and a cross-sectional view of a transistor.
Figure 15B:
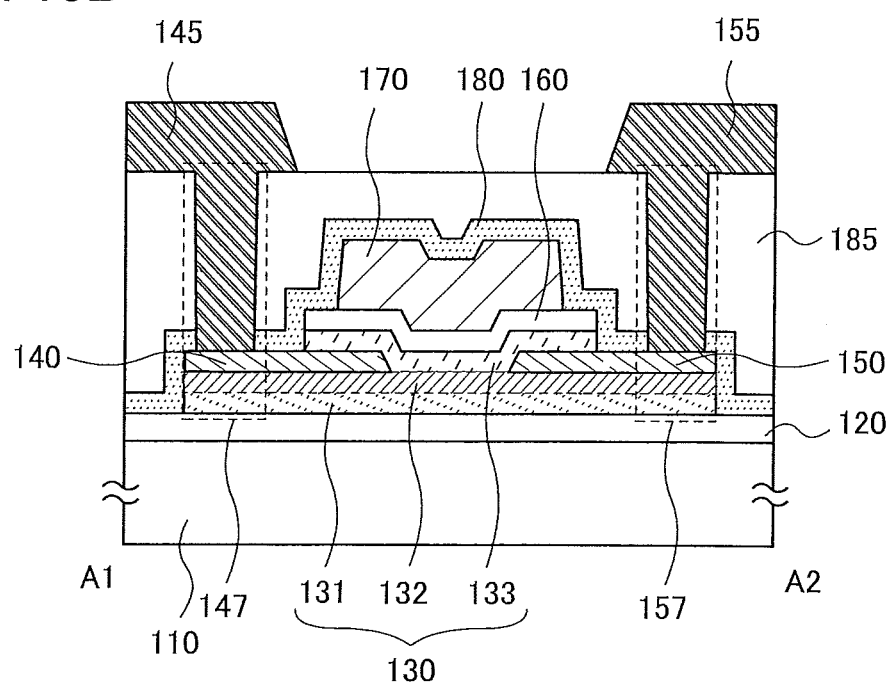

Alternatively, in a transistor of one embodiment of the present invention, as illustrated in FIGS. 15A and 15B, upper surface shapes of the third oxide semiconductor layer 133 and the gate insulating film 160 may be different from an upper surface shape of the gate electrode layer 170. The structure illustrated in FIGS. 15A and 15B can reduce gate leakage current. Note that the structure can be applied to another transistor described in this embodiment.

Since the source electrode layer 140 and the drain electrode layer 150 are formed only over the oxide semiconductor layer in the transistor of one embodiment of the present invention, there is a concern that an effective channel width is shortened and thus the on-state current decreases slightly; however, application of gate electric field to a side portion of the oxide semiconductor layer is not blocked and thus gate electric field is applied to the entire oxide semiconductor layer, whereby the S value of the transistor can be decreased. The effect is confirmed by the scientific calculation described below.

Figure 16A:
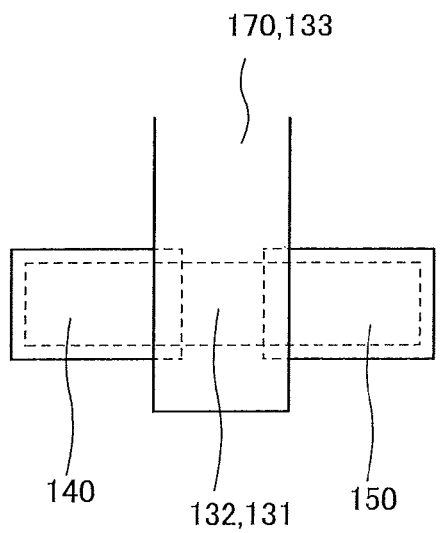
FIGS. 16A to 16D show models used for calculation and calculation results thereof.
Figure 16B:
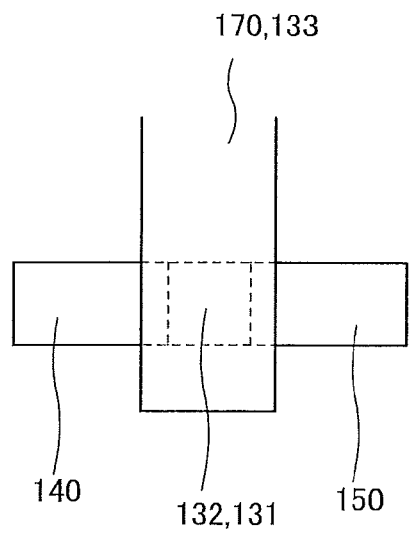

FIG. 16A is a top view of a model (a) assuming a transistor having a conventional structure, and the width of each of the source electrode layer 140 and the drain electrode layer 150 is larger than that of the oxide semiconductor layer. FIG. 16B is a top view of a model (b) assuming one embodiment of the present invention, and the width of each of the source electrode layer 140 and the drain electrode layer 150 is the same as that of the oxide semiconductor layer.

Figure 16C:
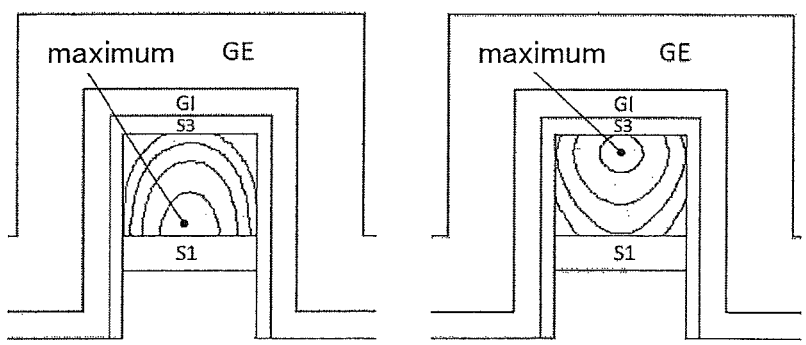

FIG. 16C shows calculation results of current density distributions in cross sections of channel portions in the W width direction at a drain current of about 1E-12 [A] in the models. The left part of FIG. 16C shows calculation results of the model (a) and the current density is high around the center of a lower layer of the channel portion. In other words, current cannot be controlled around the center of the lower layer of the channel portion. On the other hand, the right part of FIG. 16C shows calculation results of the model (b) and the current density is high near an upper layer of the channel portion. This is because gate electric field is sufficiently applied from the side surface.

Figure 16D:
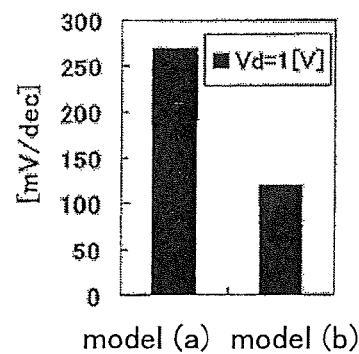

As shown in FIG. 16D, from Id-Vg characteristics obtained by calculation using the above models, it is found that the S value of the model (b) assuming one embodiment of the present invention is extremely small as compared to the model (a).

Next, components of the transistor 100 of one embodiment of the present invention are described in detail.

The substrate 110 is not limited to a simple supporting substrate, and may be a substrate where another device such as a transistor is formed. In that case, one of the gate electrode layer 170, the source electrode layer 140, and the drain electrode layer 150 of the transistor 100 may be electrically connected to the above device.

The base insulating film 120 can have a function of supplying oxygen to the oxide semiconductor layer 130 as well as a function of preventing diffusion of impurities from the substrate 110. For this reason, the base insulating film 120 is preferably an insulating film containing oxygen and further preferably, the base insulating film 120 is an insulating film containing oxygen in which the oxygen content is higher than that in the stoichiometric composition. In the case where the substrate 110 is provided with another device as described above, the base insulating film 120 also has a function as an interlayer insulating film. In that case, the base insulating film 120 is preferably subjected to planarization treatment such as chemical mechanical polishing (CMP) treatment so as to have a flat surface.

Further, in a region where a channel of the transistor 100 is formed, the oxide semiconductor layer 130 has a structure in which the first oxide semiconductor layer 131, the second oxide semiconductor layer 132, and the third oxide semiconductor layer 133 are stacked in this order from the substrate 110 side. Furthermore, in the first oxide semiconductor layer 131, a region not overlapping with the second oxide semiconductor layer 132, the source electrode layer 140, and the drain electrode layer 150 is in contact with the third oxide semiconductor layer 133, which means that the second oxide semiconductor layer 132 is surrounded by the first oxide semiconductor layer 131 and the third oxide semiconductor layer 133.

Here, for the second oxide semiconductor layer 132, for example, an oxide semiconductor whose electron affinity (an energy difference between a vacuum level and the conduction band minimum) is higher than those of the first oxide semiconductor layer 131 and the third oxide semiconductor layer 133 is used. The electron affinity can be obtained by subtracting an energy difference between the conduction band minimum and the valence band maximum (what is called an energy gap) from an energy difference between the vacuum level and the valence band maximum (what is called an ionization potential).

Figure 4A:
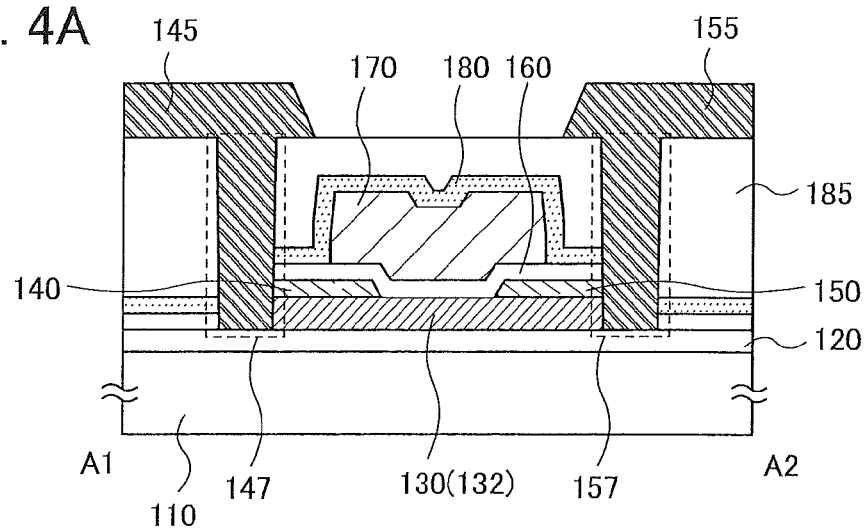
FIGS. 4A to 4C are cross-sectional views of transistors.
Figure 4B:
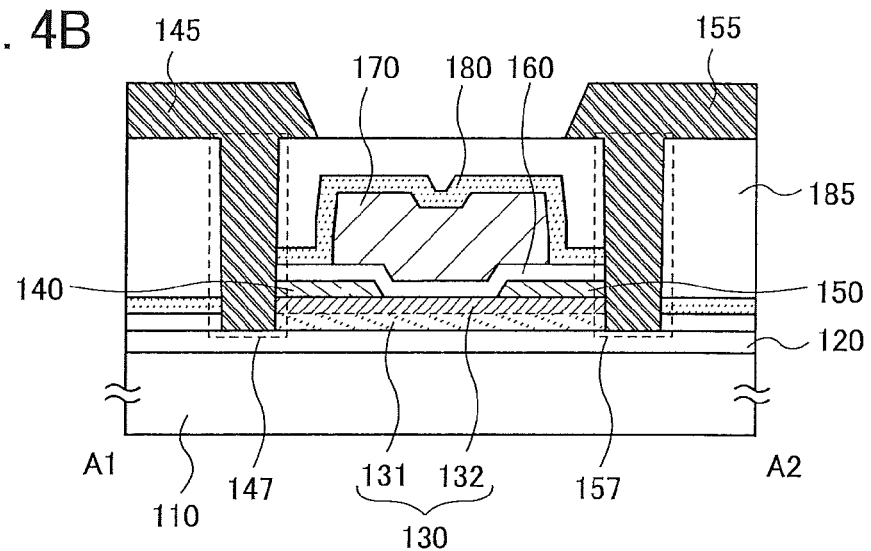
Figure 4C:
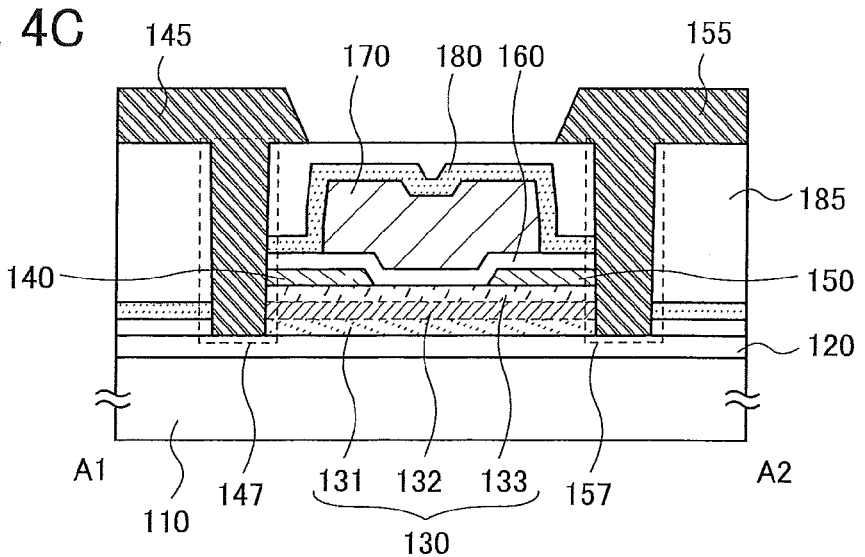

Although the case where the oxide semiconductor layer 130 is a stack of three layers is described in detail in this embodiment, the oxide semiconductor layer 130 may be a single layer or a stack of two layers or four or more layers. In the case where the oxide semiconductor layer 130 is a single layer, for example, a layer corresponding to the second oxide semiconductor layer 132 is used as illustrated in FIG. 4A. In the case where the oxide semiconductor layer 130 is a stack of two layers, for example, a structure without the third oxide semiconductor layer 133 is used as illustrated in FIG. 4B. In such a case, the second oxide semiconductor layer 132 and the first oxide semiconductor layer 131 can be replaced with each other. In the case where the oxide semiconductor layer 130 is a stack of three layers, a structure different from that in FIGS. 1A and 1B, such as that in FIG. 4C, can be employed. In the case of a stack of four or more layers, for example, a structure in which an oxide semiconductor layer is stacked over the three-layer stacked structure described in this embodiment or a structure in which an oxide semiconductor layer is provided between any of two layers in the three-layer stacked structure can be employed.

It is preferable that each of the first oxide semiconductor layer 131 and the third oxide semiconductor layer 133 contain one or more kinds of metal elements forming the second oxide semiconductor layer 132 and be formed, for example, using an oxide semiconductor whose energy of the conduction band minimum is closer to the vacuum level than that of the second oxide semiconductor layer 132 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode layer 170, a channel is formed in the second oxide semiconductor layer 132 whose conduction band minimum is the lowest in the oxide semiconductor layer 130. In other words, the third oxide semiconductor layer 133 is formed between the second oxide semiconductor layer 132 and the gate insulating film 160, whereby a structure in which the channel of the transistor is not in contact with the gate insulating film 160 is obtained.

Further, since the first oxide semiconductor layer 131 contains one or more metal elements contained in the second oxide semiconductor layer 132, an interface state is less likely to be formed at the interface of the second oxide semiconductor layer 132 with the first oxide semiconductor layer 131 than at the interface with the base insulating film 120 on the assumption that the second oxide semiconductor layer 132 is in contact with the base insulating film 120. The interface state sometimes forms a channel, leading to a change in the threshold voltage of the transistor. Thus, with the first oxide semiconductor layer 131, variation in the electrical characteristics of the transistors, such as a threshold voltage, can be reduced. Further, the reliability of the transistor can be improved.

Furthermore, since the third oxide semiconductor layer 133 contains one or more metal elements contained in the second oxide semiconductor layer 132, scattering of carriers is less likely to occur at the interface of the second oxide semiconductor layer 132 with the third oxide semiconductor layer 133 than at the interface with the gate insulating film 160 on the assumption that the second oxide semiconductor layer 132 is in contact with the gate insulating film 160. Thus, with the third oxide semiconductor layer 133, the field-effect mobility of the transistor can be increased.

For the first oxide semiconductor layer 131 and the third oxide semiconductor layer 133, for example, a material containing Al, Ti, Ga, Ge, Y, Zr, Sn, La, Ce, or Hf with a higher atomic ratio than that used for the second oxide semiconductor layer 132 can be used. Specifically, an atomic ratio of any of the above metal elements in the first oxide semiconductor layer 131 and the third oxide semiconductor layer 133 is 1.5 times or more, preferably 2 times or more, further preferably 3 times or more as much as that in the second oxide semiconductor layer 132. Any of the above elements is strongly bonded to oxygen and thus has a function of suppressing generation of an oxygen vacancy in an oxide semiconductor layer. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, the transistor can have stable electrical characteristics. However, when $y_2$ is 3 times or more as large as $x_2$, the field-effect mobility of the transistor is reduced; accordingly, $y_2$ is preferably less than 3 times $x_2$.

Note that in this specification, an atomic ratio used for describing the composition of an oxide semiconductor layer can be also used as the atomic ratio of a base material. In the case where an oxide semiconductor layer is deposited by a sputtering method using an oxide semiconductor material as a target, the composition of the oxide semiconductor layer might be different from that of the target, which is a base material, depending on the kind or a ratio of a sputtering gas, the density of the target, or deposition conditions. Thus, in this specification, an atomic ratio used for describing the composition of an oxide semiconductor layer is also used as the atomic ratio of a base material. For example, in the case where a sputtering method is used for deposition, an In—Ga—Zn oxide film whose atomic ratio of In to Ga and Zn is 1:1:1 can be also understood as an In—Ga—Zn oxide film formed using an In—Ga—Zn oxide material whose atomic ratio of In to Ga and Zn is 1:1:1 as a target.

Further, in the case where Zn and O are not taken into consideration, the proportion of In and the proportion of M in each of the first oxide semiconductor layer 131 and the third oxide semiconductor layer 133 are preferably less than 50 atomic % and greater than or equal to 50 atomic %, respectively, and further preferably less than 25 atomic % and greater than or equal to 75 atomic %, respectively. In addition, in the case where Zn and O are not taken into consideration, the proportion of In and the proportion of M in the second oxide semiconductor layer 132 are preferably greater than or equal to 25 atomic % and less than 75 atomic %, respectively, and further preferably greater than or equal to 34 atomic % and less than 66 atomic %, respectively.

The thicknesses of the first oxide semiconductor layer 131 and the third oxide semiconductor layer 133 are each greater than or equal to 1 nm and less than or equal to 100 nm, preferably greater than or equal to 3 nm and less than or equal to 50 nm. The thickness of the second oxide semiconductor layer 132 is greater than or equal to 1 nm and less than or equal to 200 nm, preferably greater than or equal to 3 nm and less than or equal to 100 nm, further preferably greater than or equal to 3 nm and less than or equal to 50 nm.

For each of the first oxide semiconductor layer 131, the second oxide semiconductor layer 132, and the third oxide semiconductor layer 133, an oxide semiconductor containing indium, zinc, and gallium can be used, for example. Note that the second oxide semiconductor layer 132 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in the oxide semiconductor layer, hydrogen, nitrogen, carbon, silicon, and a metal element other than main components are impurities. For example, hydrogen and nitrogen form donor levels to increase the carrier density, and silicon forms impurity levels in the oxide semiconductor layer. The impurity levels serve as traps and might cause the electrical characteristics of the transistor to deteriorate. Thus, it is preferable to reduce the concentration of the impurities in the first oxide semiconductor layer 131, the second oxide semiconductor layer 132, and the third oxide semiconductor layer 133, and at interfaces between the layers.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is preferably lower than $1\times10^{19}$ atoms/cm$^3$, further preferably lower than $5\times10^{18}$ atoms/cm$^3$, still further preferably lower than $1\times10^{18}$ atoms/cm$^3$. Further, the concentration of hydrogen at a certain depth of the oxide semiconductor layer or in a region of the oxide semiconductor layer is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, yet still further preferably lower than or equal to $5\times10^{18}$ atoms/cm$^3$. Further, the concentration of nitrogen at a certain depth of the oxide semiconductor layer or in a region of the oxide semiconductor layer is preferably lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor layer is used for a channel formation region has an extremely low off-state current. In the case where the voltage between a source and a drain is set to about 0.1 V, 5 V, or 10 V, for example, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, be not in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the first oxide semiconductor layer 131, the second oxide semiconductor layer 132, and the third oxide semiconductor layer 133, a channel can be formed in the second oxide semiconductor layer 132; thus, the transistor can have a high field-effect mobility and stable electrical characteristics.

In the band structures of the first oxide semiconductor layer 131, the second oxide semiconductor layer 132, and the third oxide semiconductor layer 133, the energy of the conduction band minimum continuously changes. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133. Thus, the first oxide semiconductor layer 131, the second oxide semiconductor layer 132, and the third oxide semiconductor layer 133 have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous junction (here, in particular, a well structure having a U shape in which energies of the conduction band minimums successively vary between layers). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination.

For example, an In—Ga—Zn oxide whose atomic ratio of In to Ga and Zn is 1:3:2, 1:3:3, 1:3:4, 1:3:6, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1, 5:5:6, or 3:1:2 can be used for the second oxide semiconductor layer 132.

The second oxide semiconductor layer 132 of the oxide semiconductor layer 130 serves as a well, so that a channel is formed in the second oxide semiconductor layer 132 in a transistor including the oxide semiconductor layer 130. Note that since the energies of the conduction band minimums continuously changes, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133.

However, when the energy difference between the conduction band minimum of the first oxide semiconductor layer 131 and the conduction band minimum of the second oxide semiconductor layer 132 and the energy difference between the conduction band minimum of the third oxide semiconductor layer 133 and the conduction band minimum of the second oxide semiconductor layer 132 are small, an electron in the second oxide semiconductor layer 132 might reach the trap level by passing over the energy differences. When the electron is trapped in the trap level, a negative fixed charge is generated at the interface with the insulating film, whereby the threshold voltage of the transistor is shifted in the positive direction.

Thus, to reduce fluctuations in the threshold voltage of the transistor, energy differences of at least certain values between the conduction band minimum of the second oxide semiconductor layer 132 and the conduction band minimum of each of the first oxide semiconductor layer 131 and the third oxide semiconductor layer 133 is necessary. Each of the energy differences is preferably greater than or equal to 0.1 eV, further preferably greater than or equal to 0.15 eV.

Note that the first oxide semiconductor layer 131, the second oxide semiconductor layer 132, and the third oxide semiconductor layer 133 preferably include crystal parts. In particular, when crystals in which c-axes are aligned are used, the transistor can have stable electrical characteristics.

In the case where an In—Ga—Zn oxide is used for the oxide semiconductor layer 130, it is preferable that the third oxide semiconductor layer 133 contain less In than the second oxide semiconductor layer 132 so that diffusion of In to the gate insulating film is prevented.

For the source electrode layer 140, the drain electrode layer 150, the first wiring 145, the second wiring 155, and the third wiring 175, a conductive material which is easily bonded to oxygen is preferably used. For example, Al, Cr, Cu, Ta, Ti, Mo, or W can be used. Among the materials, it is particularly preferable to use Ti, which is easily bonded to oxygen, or W, which has a high melting point and thus allows subsequent process temperatures to be relatively high. Note that the conductive material which is easily bonded to oxygen includes, in its category, a material to which oxygen is easily diffused. Note that the first wiring 145, the second wiring 155, and the third wiring 175 may each be a stack such as Ti/Al/Ti.

In addition, a conductive material which is not easily bonded to oxygen may be used as needed. For example, it is possible to use a single layer formed of a material containing tantalum nitride, titanium nitride, gold, platinum, palladium, or ruthenium or a stack of the conductive material and the above conductive material which is easily bonded to oxygen.

When the conductive material which is easily bonded to oxygen is in contact with an oxide semiconductor layer, a phenomenon occurs in which oxygen in the oxide semiconductor layer is diffused into the conductive material which is easily bonded to oxygen. The phenomenon noticeably occurs when the temperature is high. Thus, by a heat treatment step in the manufacturing process of the transistor, oxygen vacancies are generated in a region of the oxide semiconductor layer, which is in the vicinity of the interface between the oxide semiconductor layer and each of the source electrode layer and the drain electrode layer. The oxygen vacancies are bonded to hydrogen slightly contained in the film, whereby the region is likely changed to an n-type. Thus, the n-type region can serve as a source or a drain of the transistor.

Figure 5:
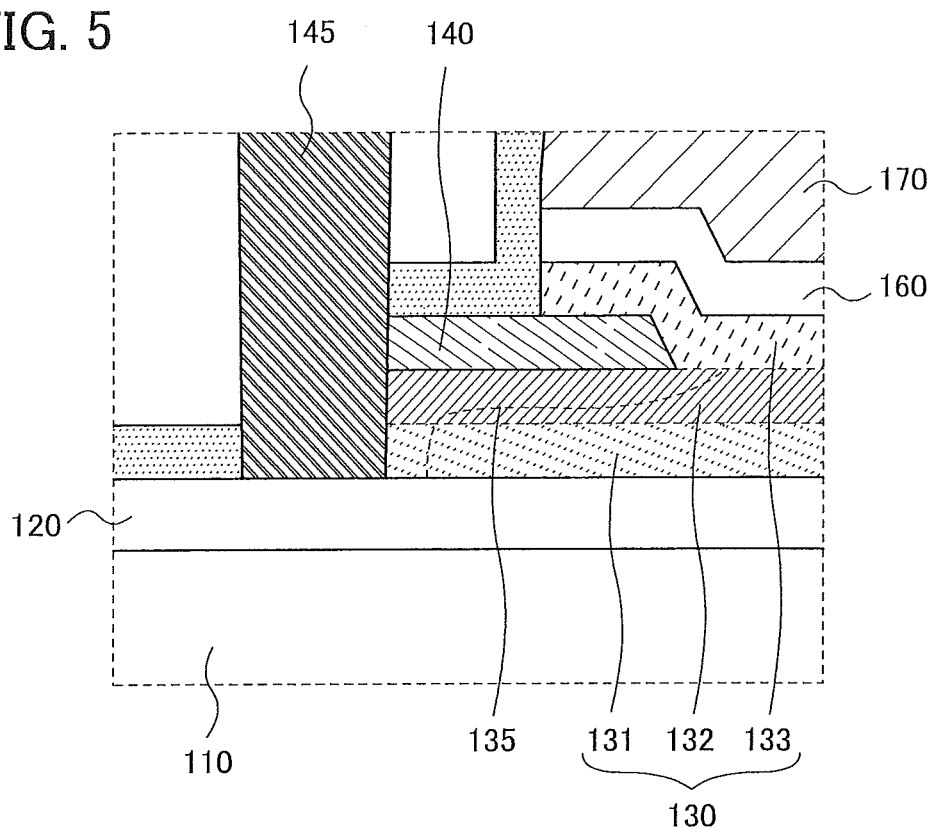
FIG. 5 is a cross-sectional view of a transistor.

The n-type region is illustrated in an enlarged cross-sectional view of the transistor (showing part of a cross section in the channel length direction, which is near the source electrode layer 140) in FIG. 5. A boundary 135 indicated by a dotted line in the first oxide semiconductor layer 131 and the second oxide semiconductor layer 132 is a boundary between an intrinsic semiconductor region and an n-type semiconductor region. In the first oxide semiconductor layer 131 and the second oxide semiconductor layer 132, a region near the source electrode layer 140 and the first wiring 145 becomes an n-type region. The boundary 135 is schematically illustrated here, but actually, the boundary is not clearly seen in some cases. Although FIG. 5 shows that part of the boundary 135 extends in the lateral direction in the second oxide semiconductor layer 132, a region in the first oxide semiconductor layer 131 and the second oxide semiconductor layer 132, which is sandwiched between the source electrode layer 140 and the base insulating film 120, becomes n-type entirely in the thickness direction, in some cases.

In one embodiment of the present invention, the first wiring 145 and the second wiring 155 are connected to the first oxide semiconductor layer 131 and the second oxide semiconductor layer 132 by side contact, an n-type region formed in the first oxide semiconductor layer 131 and the second oxide semiconductor layer 132 can be enlarged. The n-type region serves as a source (or a drain) of the transistor. When the n-type region is enlarged, the series resistance between a channel formation region and the source electrode (or the drain electrode) or between the channel formation region and the first wiring 145 (or the second wiring 155) can be reduced and the electrical characteristics of the transistor can be improved.

In the case of forming a transistor with an extremely short channel length, an n-type region which is formed by the generation of oxygen vacancies might extend in the channel length direction of the transistor. In that case, the electrical characteristics of the transistor change; for example, the threshold voltage is shifted, or on and off states of the transistor is hard to control with the gate voltage (in which case the transistor is turned on). Accordingly, when a transistor with an extremely short channel length is formed, it is not always preferable that a conductive material easily bonded to oxygen be used for a source electrode layer and a drain electrode layer.

In such a case, a conductive material which is less likely to be bonded to oxygen than the above material can be used for the source electrode layer 140 and the drain electrode layer 150. As the conductive material which is not easily bonded to oxygen, for example, a material containing tantalum nitride, titanium nitride, gold, platinum, palladium, or ruthenium or the like can be used. Note that in the case where the conductive material is in contact with the second oxide semiconductor layer 132, the source electrode layer 140 and the drain electrode layer 150 may each have a structure in which the conductive material which is not easily bonded to oxygen and the above-described conductive material that is easily bonded to oxygen are stacked.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack including any of the above materials.

For the gate electrode layer 170, a conductive film formed using Al, Ti, Cr, Co, Ni, Cu, Y, Zr, Mo, Ru, Ag, Ta, W, or the like can be used. The gate electrode layer may be a stack including any of the above materials. Alternatively, a conductive film containing nitrogen may be used for the gate electrode layer.

An aluminum oxide film is preferably contained in the gate insulating film 160 and the insulating layer 180 over the gate electrode layer 170. The aluminum oxide film has a high shielding effect (blocking effect) of preventing penetration of both oxygen and impurities such as hydrogen and moisture. Accordingly, the aluminum oxide film can be suitably used as a protective film that prevents entry of an impurity such as hydrogen or moisture, which causes variation in the electrical characteristics of the transistor, into the oxide semiconductor layer 130, release of oxygen, which is a main component material of the oxide semiconductor layer 130, from the oxide semiconductor layer during and after the manufacturing process of the transistor, and unnecessary release of oxygen from the base insulating film 120. Further, oxygen contained in the aluminum oxide film can be diffused into the oxide semiconductor layer.

Further, the insulating layer 185 is preferably formed over the insulating layer 180. The insulating layer 185 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 185 may be a stack including any of the above materials.

Here, the insulating layer 185 preferably contains excess oxygen. An insulating layer containing excess oxygen refers to an insulating layer from which oxygen can be released by heat treatment or the like. The insulating layer containing excess oxygen is preferably a film in which the amount of released oxygen when converted into oxygen atoms is $1.0 \times 10^{19}$ atoms/cm$^3$ or more in thermal desorption spectroscopy analysis. Oxygen released from the insulating layer can be diffused into the channel formation region in the oxide semiconductor layer 130 through the gate insulating film 160, so that oxygen vacancies formed in the channel formation region can be filled with the oxygen. In this manner, the electrical characteristics of the transistor can be stable.

High integration of a semiconductor device requires miniaturization of a transistor. However, it is known that miniaturization of a transistor causes deterioration of the electrical characteristics of the transistor. In particular, a reduction in on-state current, which is directly caused by a decrease in channel width, is significant.

However, in the transistor of one embodiment of the present invention, as described above, the third oxide semiconductor layer 133 is formed so as to cover the second oxide semiconductor layer 132 where a channel is formed and the channel formation layer and the gate insulating film are not in contact with each other. Accordingly, scattering of carriers at the interface between the second oxide semiconductor layer 132 where a channel is formed and the gate insulating film can be reduced and the field-effect mobility of the transistor can be increased.

Figure 6A:
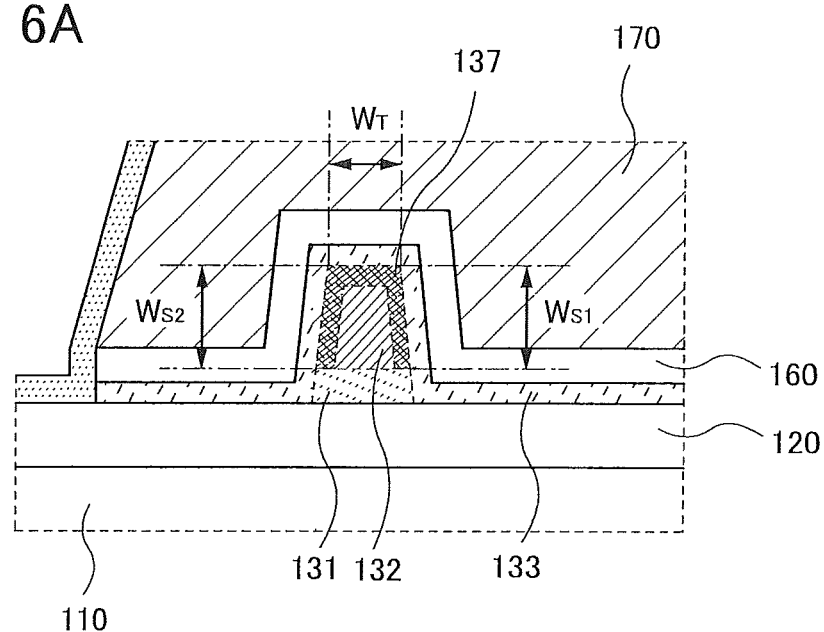
FIGS. 6A and 6B are cross-sectional views of transistors.
Figure 6B:
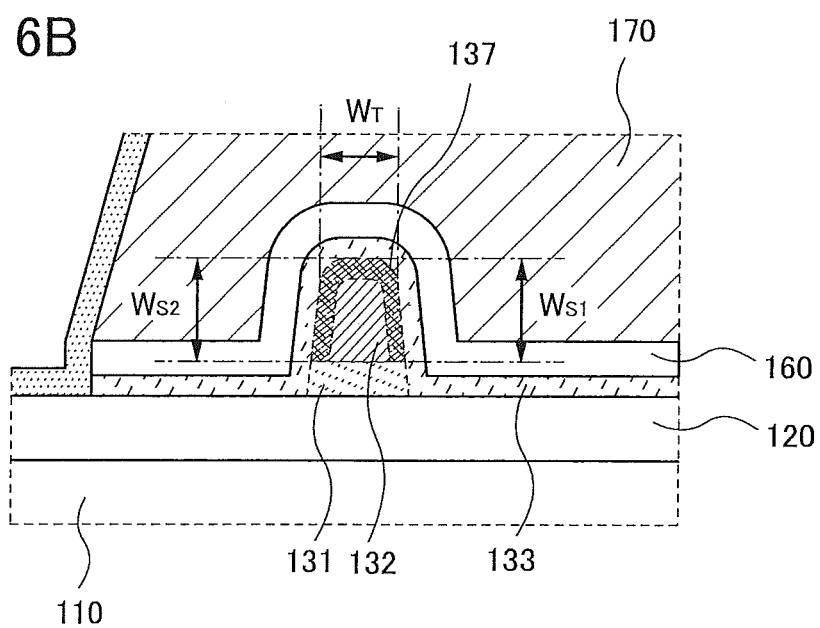

The transistor of one embodiment of the present invention can have particular improved electrical characteristics when having a structure in which the length ($W_T$) of a top surface of the second oxide semiconductor layer 132 in the channel width direction is as large as or smaller than the thickness of the oxide semiconductor layer, as in a cross-sectional diagram in the channel width direction in FIGS. 6A and 6B. Note that in the cross section in the channel width direction, the second oxide semiconductor layer 132 may have tapered side surfaces and an upper surface having a flat portion as illustrated in FIG. 6A. Alternatively, as illustrated in FIG. 6B, the second oxide semiconductor layer 132 may have tapered side surfaces and an upper surface having a curvature.

In the case where $W_T$ is sufficiently small as in either of the transistors illustrated in FIGS. 6A and 6B, for example, an electric field from the gate electrode layer 170 to the side surface of the second oxide semiconductor layer 132 is applied to the entire second oxide semiconductor layer 132; thus, a channel is formed equally in the side and top surfaces of the second oxide semiconductor layer 132.

In the case where a channel region 137 as in either of FIGS. 6A and 6B is formed in the transistor, the channel width can be defined as the sum of $W_T$ and the lengths of the side surfaces ($W_{S1}$ and $W_{S2}$) of the second oxide semiconductor layer 132 in the channel width direction (i.e., $W_T+W_{S1}+W_{S2}$), and on-state current flows in the transistor in accordance with the channel width. In the case where $W_T$ is sufficiently small, current flows in the entire second oxide semiconductor layer 132.

In other words, the transistor illustrated in FIGS. 6A and 6B has a higher on-state current than that of the conventional transistor because the transistor illustrated in FIGS. 6A and 6B has an effect of suppressing scattering of carriers and an effect of extending the effective channel width.

Note that in order to efficiently increase the on-state current of the transistor when $W_{S1}$ and $W_{S2}$ are represented by $W_S$ ($W_{S1}=W_{S2}=W_S$), a relation $0.3W_S \leq W_T \leq 3W_S$ ($W_T$ is greater than or equal to $0.3W_S$ and less than or equal to $3W_S$) is satisfied. Further, $W_T/W_S$ is preferably greater than or equal to 0.5 and less than or equal to 1.5, further preferably greater than or equal to 0.7 and less than or equal to 1.3. In the case where $W_T/W_S>3$, the S value and the off-state current might be increased.

As described above, with the transistor of one embodiment of the present invention, sufficiently high on-state current can be obtained even when the transistor is miniaturized.

In the transistor of one embodiment of the present invention, the second oxide semiconductor layer 132 is formed over the first oxide semiconductor layer 131, so that an interface state is less likely to be formed. In addition, impurities do not enter the second oxide semiconductor layer 132 from above and below because the second oxide semiconductor layer 132 is an intermediate layer in a three-layer structure. Since the second oxide semiconductor layer 132 is surrounded by the first oxide semiconductor layer 131 and the third oxide semiconductor layer 133, not only can the on-state current of the transistor be increased but also the threshold voltage can be stabilized and the S value (subthreshold value) can be reduced. Thus, Icut (current when gate voltage VG is 0 V) can be reduced and power consumption can be reduced. Further, the threshold voltage of the transistor becomes stable; thus, long-term reliability of the semiconductor device can be improved.

Figure 7:
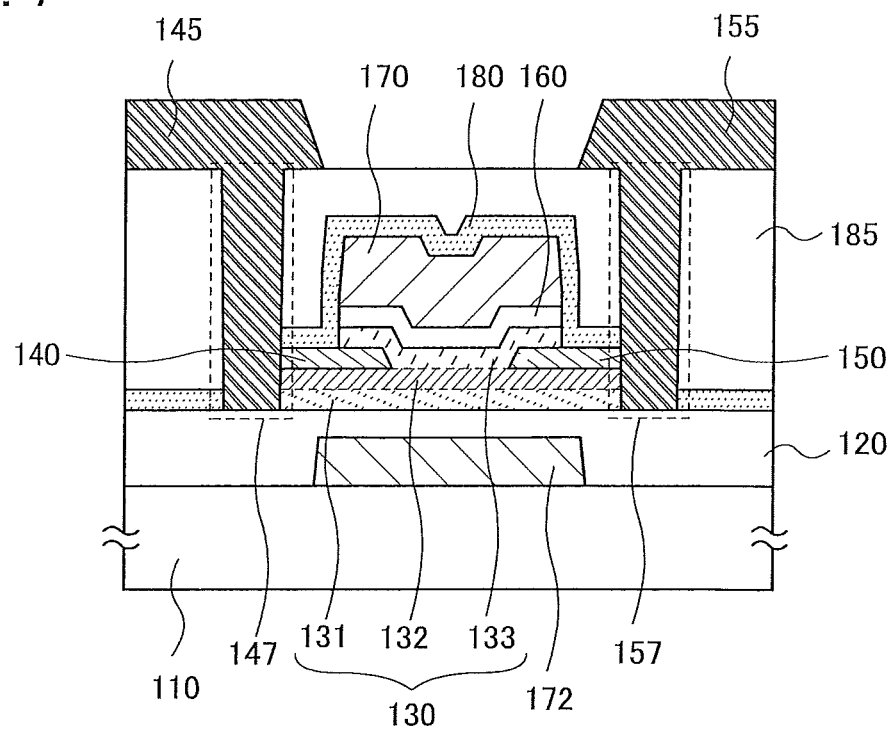
FIG. 7 is a cross-sectional view of a transistor.

The transistor of one embodiment of the present invention may include a conductive film 172 between the oxide semiconductor layer 130 and the substrate 110 as illustrated in FIG. 7. When the conductive film is used as a second gate electrode, the on-state current can be further increased and the threshold voltage can be controlled. In order to increase the on-state current, for example, the gate electrode layer 170 and the conductive film 172 are set to have the same potential, and the transistor is driven as a dual-gate transistor. Further, to control the threshold voltage, a fixed potential, which is different from a potential of the gate electrode layer 170, is supplied to the conductive film 172.

This embodiment can be combined as appropriate with any of the other embodiments and an example in this specification.

Embodiment 2

In this embodiment, a method for manufacturing the transistor 100, which is described in Embodiment 1 with reference to FIGS. 1A and 1B, is described with reference to FIGS. 9A to 9C, FIGS. 10A and 10B, and FIGS. 11A and 11B.

For the substrate 110, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Further alternatively, any of these substrates further provided with a semiconductor element can be used.

The base insulating film 120 can be formed by a plasma chemical vapor deposition (CVD) method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack including any of the above materials may be used, and at least an upper layer of the base insulating film 120 which is in contact with the oxide semiconductor layer 130 is preferably formed using a material containing excess oxygen that might serve as a supply source of oxygen to the oxide semiconductor layer 130.

Oxygen may be added to the base insulating film 120 by an ion implantation method, an ion doping method, a plasma immersion ion implantation method, or the like. Adding oxygen enables the base insulating film 120 to supply oxygen much easily to the oxide semiconductor layer 130.

In the case where a surface of the substrate 110 is made of an insulator and there is no influence of impurity diffusion to the oxide semiconductor layer 130 to be formed later, the base insulating film 120 is not necessarily provided.

Next, a first oxide semiconductor film 331 to be the first oxide semiconductor layer 131 and a second oxide semiconductor film 332 to be the second oxide semiconductor layer 132 are deposited over the base insulating film 120 by a sputtering method, a CVD method, an MBE method, an atomic layer deposition (ALD) method, or a PLD method.

The first oxide semiconductor film 331 and the second oxide semiconductor film 332 are preferably stacked successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation of the chamber but also high purity of a sputtering gas is necessary to obtain a highly purified intrinsic oxide semiconductor. An oxygen gas or an argon gas used as the sputtering gas is highly purified to have a dew point of −40° C. or lower, preferably −80° C. or lower, further preferably −100° C. or lower, so that entry of moisture and the like into the oxide semiconductor layer can be prevented as much as possible.

For the first oxide semiconductor film 331, the second oxide semiconductor film 332, and a third oxide semiconductor film 333 to be the third oxide semiconductor layer 133 formed in a later step, any of the materials described in Embodiment 1 can be used. For example, an In—Ga—Zn oxide whose atomic ratio of In to Ga and Zn is 1:3:6, 1:3:4, 1:3:3, or 1:3:2 can be used for the first oxide semiconductor film 331, an In—Ga—Zn oxide whose atomic ratio of In to Ga and Zn is 1:1:1, 5:5:6, or 3:1:2 can be used for the second oxide semiconductor film 332, and an In—Ga—Zn oxide whose atomic ratio of In to Ga and Zn is 1:3:6, 1:3:4, 1:3:3, or 1:3:2 can be used for the third oxide semiconductor film 333.

An oxide semiconductor that can be used for each of the first oxide semiconductor film 331, the second oxide semiconductor film 332, and the third oxide semiconductor film 333 preferably contains at least indium (In) or zinc (Zn). Alternatively, the oxide semiconductor preferably contains both In and Zn. In order to reduce variation in the electrical characteristics of the transistor including the oxide semiconductor, the oxide semiconductor preferably contains a stabilizer in addition to In and/or Zn.

Examples of a stabilizer include gallium (Ga), tin (Sn), hafnium (Hf), aluminum (Al), and zirconium (Zr). Other examples of a stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain a metal element other than In, Ga, and Zn. Further, in this specification, a film formed using an In—Ga—Zn oxide is also referred to as an IGZO film.

Alternatively, a material represented by $InAlO_3(ZnO)_m$ (m>0, where m is not an integer) may be used. Note that M represents one or more metal elements selected from Ga, Y, Zr, La, Ce, and Nd. Further alternatively, a material represented by $In_2SnO_5(ZnO)_n$ (n>0, where n is an integer) may be used.

Note that as described in Embodiment 1 in detail, the second oxide semiconductor layer 132 is formed so as to have an electron affinity higher than that of the first oxide semiconductor layer 131 and that of the third oxide semiconductor layer 133.

The oxide semiconductor layers are each preferably formed by a sputtering method. As a sputtering method, an RF sputtering method, a DC sputtering method, an AC sputtering method, or the like can be used.

In the case of using an In—Ga—Zn oxide, a material whose atomic ratio of In to Ga and Zn is any of 1:1:1, 2:2:1, 2:2:3, 3:1:2, 5:5:6, 1:3:2, 1:3:3, 1:3:4, 1:3:6, 1:4:3, 1:5:4, 1:6:6, 1:6:4, 1:9:6, 1:1:4, and 1:1:2 can be used for the first oxide semiconductor film 331, the second oxide semiconductor film 332, and/or the third oxide semiconductor film 333.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The indium content of the second oxide semiconductor film 332 is preferably higher than the indium content of the first oxide semiconductor film 331 and the indium content of the third oxide semiconductor film 333. In an oxide semiconductor, the s orbital of heavy metal mainly contributes to carrier transfer, and when the proportion of In in the oxide semiconductor is increased, overlap of the s orbitals is likely to be increased. Thus, an oxide having a composition in which the proportion of In is higher than that of Ga has higher mobility than an oxide having a composition in which the proportion of In is equal to or lower than that of Ga. For this reason, with the use of an oxide having a high indium content for the second oxide semiconductor film 332, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (θ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystal are aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a reduction in crystallinity. Further, a heavy metal such as iron or nickel, argon, carbon dioxide, or the like has a large atomic radius (or molecular radius), and thus disturbs the atomic arrangement of the oxide semiconductor film and causes a reduction in crystallinity when it is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, an oxygen vacancy in the oxide semiconductor film serves as a carrier trap or a carrier generation source in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variation in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with a TEM, crystal parts cannot be found clearly in the microcrystalline oxide semiconductor in some cases. In most cases, the size of a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film obtained with a TEM, for example, a crystal grain cannot be observed clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is observed in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. In some cases, in a nanobeam electron diffraction pattern of the nc-OS film, regions with high luminance in a circular (ring) pattern are observed. Further, in a nanobeam electron diffraction pattern of the nc-OS film, a plurality of spots are shown in a ring-like region in some cases.

Since an nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than a CAAC-OS film.

Note that an oxide semiconductor film may be a stacked film including two or more films of an amorphous oxide semiconductor film, a microcrystalline oxide semiconductor film, and a CAAC-OS film, for example.

A CAAC-OS film can be deposited by a sputtering method with a polycrystalline oxide semiconductor sputtering target, for example. When ions collide with the sputtering target, a crystal region included in the sputtering target may be separated from the target along the a-b plane; in other words, a sputtered particle having a plane parallel to the a-b plane (a flat-plate-like sputtered particle or a pellet-like sputtered particle) might flake off from the target. In this case, the flat-plate-like or pellet-like sputtered particle is electrically charged and thus reaches a substrate while maintaining its crystal state without being aggregated in plasma, whereby a CAAC-OS film can be formed.

In the case where the second oxide semiconductor film 332 is formed using an In-M-Zn oxide (M is Ga, Y, Zr, La, Ce, or Nd) and a sputtering target whose atomic ratio of In to M and Zn is $a_1:b_1:c_1$ is used for forming the second oxide semiconductor film 332, $a_1/b_1$ is preferably greater than or equal to ⅓ and less than or equal to 6, further preferably greater than or equal to 1 and less than or equal to 6, and $c_1/b_1$ is preferably greater than or equal to ⅓ and less than or equal to 6, further preferably greater than or equal to 1 and less than or equal to 6. Note that when $c_1/b_1$ is greater than or equal to 1 and less than or equal to 6, a CAAC-OS film is easily formed as the second oxide semiconductor film 332. Typical examples of the atomic ratio of In to M and Zn of the target are 1:1:1, 3:1:2, and 5:5:6.

In the case where the first oxide semiconductor film 331 and the third oxide semiconductor film 333 are each formed using an In-M-Zn oxide (M is Ga, Y, Zr, La, Ce, or Nd) and a sputtering target whose atomic ratio of In to M and Zn is $a_2:b_2:c_2$ is used for forming the first oxide semiconductor film 331 and the third oxide semiconductor film 333, $a_2/b_2$ is preferably less than $a_1/b_1$, and $c_2/b_2$ is preferably greater than or equal to ⅓ and less than or equal to 6, further preferably greater than or equal to 1 and less than or equal to 6. Note that when $c_2/b_2$ is greater than or equal to 1 and less than or equal to 6, CAAC-OS films are easily formed as the first oxide semiconductor film 331 and the third oxide semiconductor film 333. Typical examples of the atomic ratio of In to M and Zn of the target are 1:3:2, 1:3:3, 1:3:4, and 1:3:6.

First heat treatment may be performed after the second oxide semiconductor film 332 is formed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the second oxide semiconductor film 332 can be improved, and in addition, impurities such as hydrogen and water can be removed from the base insulating film 120 and the first oxide semiconductor film 331. Note that the first heat treatment may be performed after etching for formation of the first oxide semiconductor layer 131 and the second oxide semiconductor layer 132 which is described later.

Next, a first conductive film 340 is formed over the second oxide semiconductor film 332. For the first conductive film 340, Al, Cr, Cu, Ta, Ti, Mo, W, or an alloy material containing any of these as its main component can be used. For example, a tungsten film with a thickness of 5 nm to 25 nm is formed by a sputtering method, a CVD method, or the like.

Figure 8A:
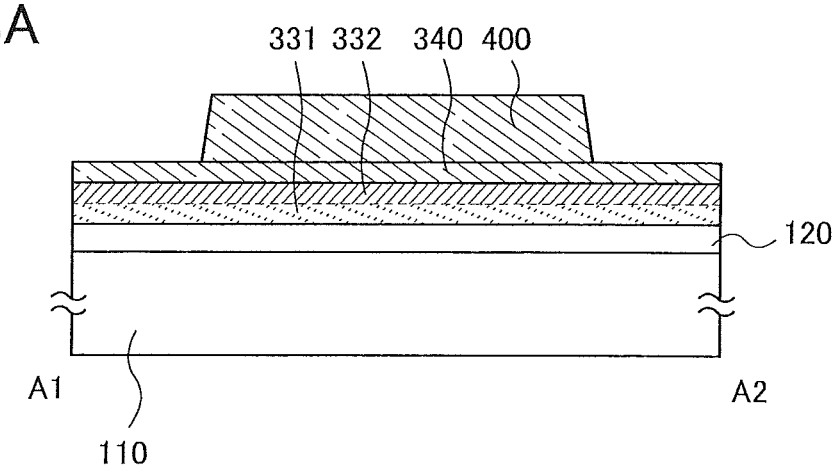
FIGS. 8A to 8C are cross-sectional views illustrating a method for manufacturing a transistor.

Next, a first resist mask 400 is formed over the first conductive film 340 (see FIG. 8A). It is preferable that the first resist mask 400 be formed by a photolithography process using electron beam exposure, liquid immersion exposure, or EUV exposure, for example. With such a process, the first resist mask 400 having an extremely minute shape can be formed.

Next, the first conductive film 340 is selectively etched using the first resist mask 400 as a mask, so that a first conductive layer 341 having an upper surface shape similar to an upper surface shape of the first resist mask 400 is formed.

Here, the first conductive layer 341 is used as a hard mask. In an etching step, the shape of a resist mask is changed because of change in quality and reduction in thickness. Thus, when the second oxide semiconductor layer 132 and the first oxide semiconductor layer 131 are formed using only a resist mask, the second oxide semiconductor layer 132 and the first oxide semiconductor layer 131 reflect the changed shape of the resist mask and thus cannot have a desired shape. When the first conductive layer 341 is used as a hard mask, the second oxide semiconductor layer 132 and the first oxide semiconductor layer 131 can be formed to have a desired shape.

Figure 8B:
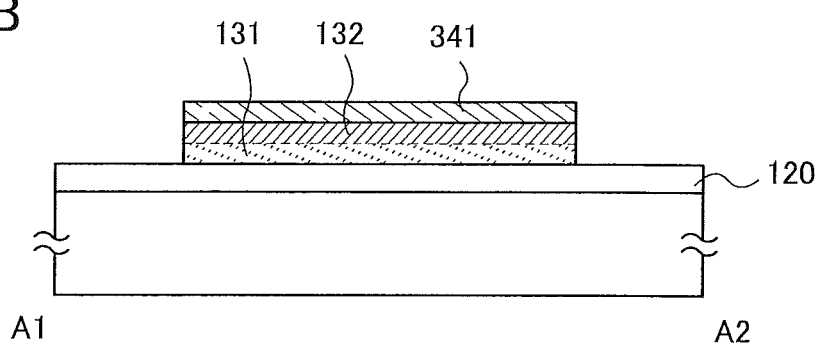

The second oxide semiconductor film 332 and the first oxide semiconductor film 331 are selectively etched, so that the second oxide semiconductor layer 132 and the first oxide semiconductor layer 131 are formed (see FIG. 8B). Note that the base insulating film 120 may be partly etched by over-etching the first oxide semiconductor film 331.

Figure 8C:
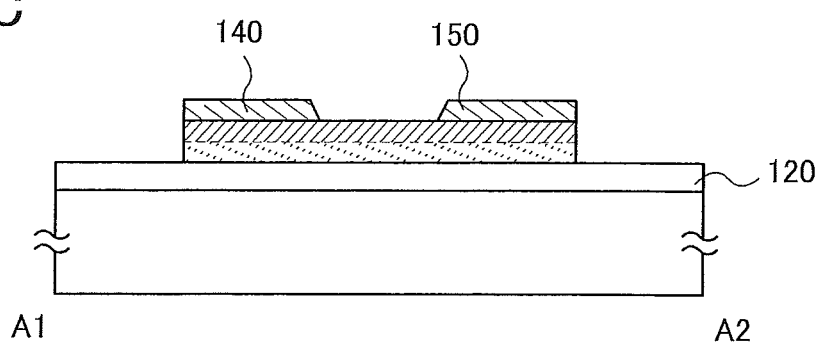

Next, a second resist mask is formed over the first conductive layer 341 by a method similar to that of the first resist mask 400. Then, the first conductive layer 341 is selectively etched using the second resist mask as a mask, so that the source electrode layer 140 and the drain electrode layer 150 are formed (see FIG. 8C). Note that the first conductive layer 341 may be over-etched so that the second oxide semiconductor layer 132 is partly etched.

Subsequently, the third oxide semiconductor film 333 to be the third oxide semiconductor layer 133 is formed over the first oxide semiconductor layer 131, the second oxide semiconductor layer 132, the source electrode layer 140, and the drain electrode layer 150.

Note that second heat treatment may be performed after the third oxide semiconductor film 333 is formed. The second heat treatment can be performed under the conditions similar to those of the first heat treatment. The second heat treatment can remove impurities such as hydrogen and water from the third oxide semiconductor film 333, the first oxide semiconductor layer 131, and the second oxide semiconductor layer 132.

Next, an insulating film 360 to be the gate insulating film 160 is formed over the third oxide semiconductor film 333. The insulating film 360 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 360 may be a stack including any of the above materials. The insulating film 360 can be formed by a sputtering method, a CVD method, an MBE method, an ALD method, a PLD method, or the like.

Figure 9A:
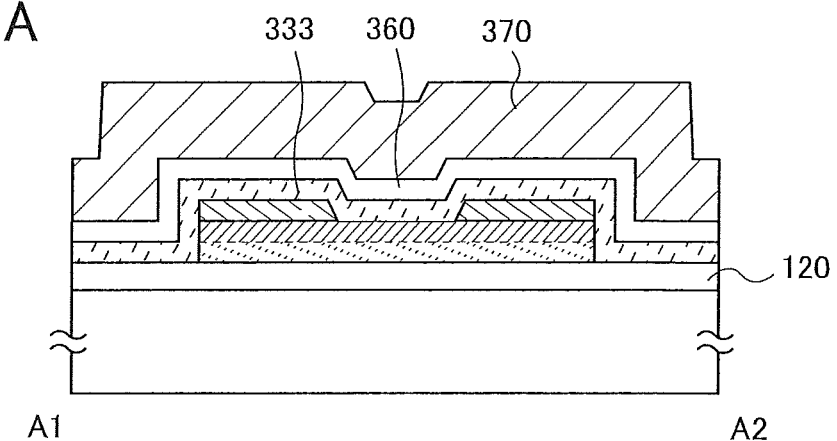
FIGS. 9A to 9C are cross-sectional views illustrating a method for manufacturing a transistor.

Then, a second conductive film 370 to be the gate electrode layer 170 is formed over the insulating film 360 (see FIG. 9A). For the second conductive film 370, Al, Ti, Cr, Co, Ni, Cu, Y, Zr, Mo, Ru, Ag, Ta, W, or an alloy material containing any of these as its main component can be used. The second conductive film 370 can be formed by a sputtering method, a CVD method, or the like. A stack including a conductive film containing any of the above materials and a conductive film containing nitrogen, or a conductive film containing nitrogen may be used for the second conductive film 370.

After that, a third resist mask is formed over the second conductive film 370, and the second conductive film 370 is selectively etched using the third resist mask to form the gate electrode layer 170.

Then, the insulating film 360 is selectively etched using the gate electrode layer 170 as a mask to form the gate insulating film 160.

Figure 9B:
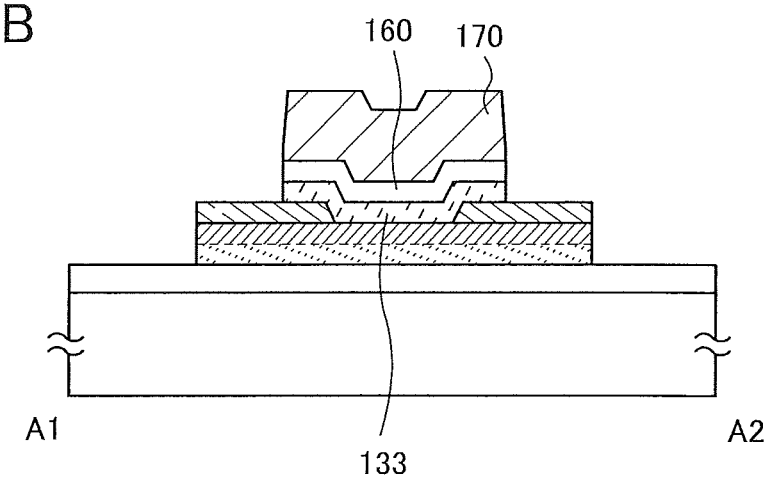

Subsequently, the third oxide semiconductor film 333 is etched using the gate electrode layer 170 or the gate insulating film 160 as a mask to form the third oxide semiconductor layer 133 (see FIG. 9B).

The second conductive film 370, the insulating film 360, and the third oxide semiconductor film 333 may be etched individually or successively. Further, either dry etching or wet etching may be used as the etching method, and an appropriate etching method may be selected individually.

Figure 9C:
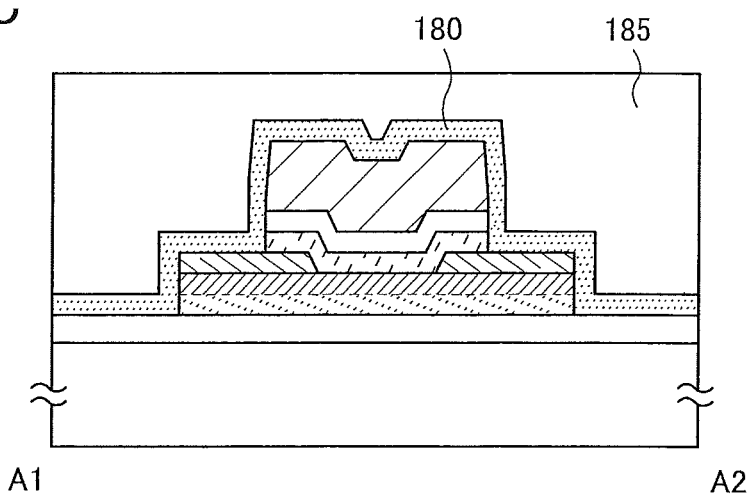

Next, the insulating layer 180 and the insulating layer 185 are formed over the source electrode layer 140, the drain electrode layer 150, and the gate electrode layer 170 (see FIG. 9C). The insulating layer 180 and the insulating layer 185 can each be formed using a material and a method which are similar to those of the base insulating film 120. In particular, aluminum oxide is preferably used for the insulating layer 180.

Oxygen may be added to the insulating layer 180 and/or the insulating layer 185 by an ion implantation method, an ion doping method, a plasma immersion ion implantation method, or the like. Adding oxygen enables the insulating layer 180 and/or the insulating layer 185 to supply oxygen much easily to the oxide semiconductor layer 130.

Next, third heat treatment may be performed. The third heat treatment can be performed under conditions similar to those of the first heat treatment. By the third heat treatment, excess oxygen is easily released from the base insulating film 120, the gate insulating film 160, the insulating layer 180, and the insulating layer 185, so that oxygen vacancies in the oxide semiconductor layer 130 can be reduced.

Figure 10A:
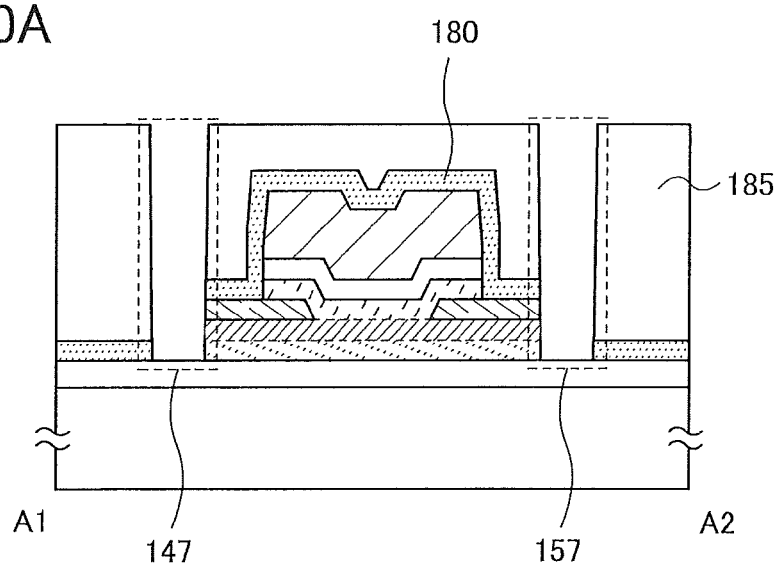
FIGS. 10A and 10B are cross-sectional views illustrating a method for manufacturing a transistor.
Figure 10B:
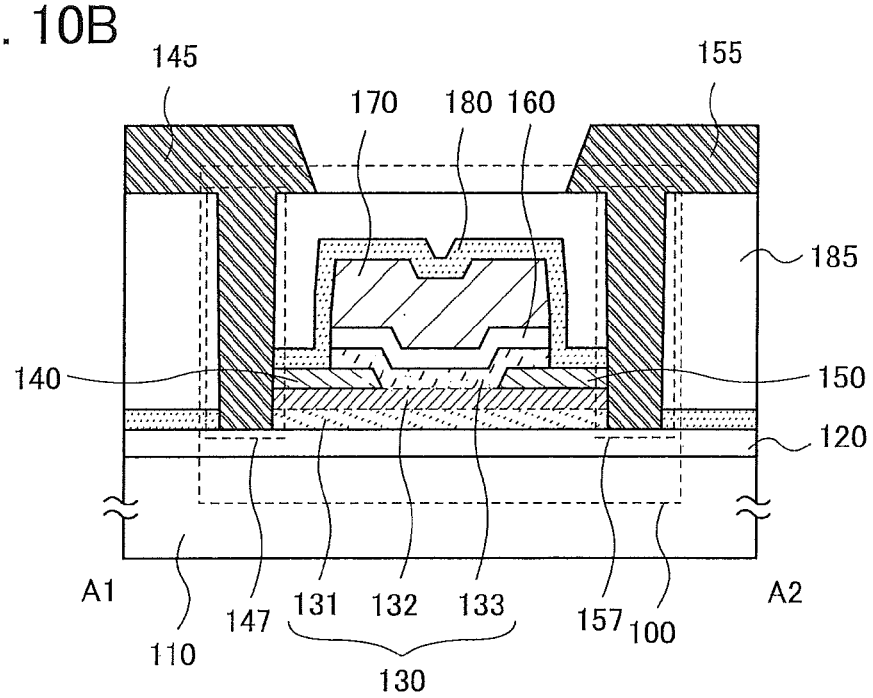

Next, a fourth resist mask is formed over the insulating layer 185, and the insulating layer 185, the insulating layer 180, the source electrode layer 140, the drain electrode layer 150, the second oxide semiconductor layer 132, and the first oxide semiconductor layer 131 are selectively etched using the fourth resist mask, so that the first opening 147 and the second opening 157 are formed (see FIG. 10A). At this time, the third opening 177 illustrated in FIG. 2A is also formed.

Note that the insulating layer 185, the insulating layer 180, the source electrode layer 140, the drain electrode layer 150, the second oxide semiconductor layer 132, and the first oxide semiconductor layer 131 may be etched individually or successively. Further, either dry etching or wet etching may be used as the etching method, and an appropriate etching method may be selected individually.

By controlling etching conditions at this time, transistors having different structures illustrated in FIGS. 3A to 3C can be formed.

After that, the first wiring 145 and the second wiring 155 are formed to cover the first opening 147 and the second opening 157. The second oxide semiconductor layer 132 and the source electrode layer 140 are electrically connected to the first wiring 145, and the second oxide semiconductor layer 132 and the drain electrode layer 150 are electrically connected to the second wiring 155 (see FIG. 10B). Further, at this time, the third wiring 175 is formed to cover the third opening 177 illustrated in FIG. 2A and is electrically connected to the gate electrode layer 170.

Note that the first wiring 145, the second wiring 155, and the third wiring 175 can be formed using a material and a method similar to those of the source electrode layer 140, the drain electrode layer 150, or the gate electrode layer 170.

Through the above process, the transistor 100 illustrated in FIGS. 1A and 1B can be fabricated.

A variety of films such as the metal film described in this embodiment can be formed typically by a sputtering method or a plasma CVD method; however, these films may be formed by another method such as a thermal CVD method. A metal organic chemical vapor deposition (MOCVD) method and an ALD method are given as examples of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first source gas, and then a second source gas is introduced, whereby the source gases are not mixed. Note that in the case where the first source gas and the inert gas are introduced at a time, the inert gas serves as a carrier gas, and the inert gas may also be introduced at the same time as the introduction of the second source gas. Instead of the introduction of the inert gas, the first source gas may be exhausted by vacuum evacuation, and then the second source gas may be introduced. The first source gas is adsorbed on the surface of the substrate to form a first layer and then, the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that the tungsten film is formed. Note that an $SiH_4$ gas may be used instead of a $B_2H_6$ gas.

This embodiment can be combined as appropriate with any of the other embodiments and an example in this specification.

Embodiment 3

In this embodiment, an example of a semiconductor device (storage device) which includes the transistor of one embodiment of the present invention, which can retain stored data even when not powered, and which has an unlimited number of write cycles is described with reference to drawings.

Figure 11A:
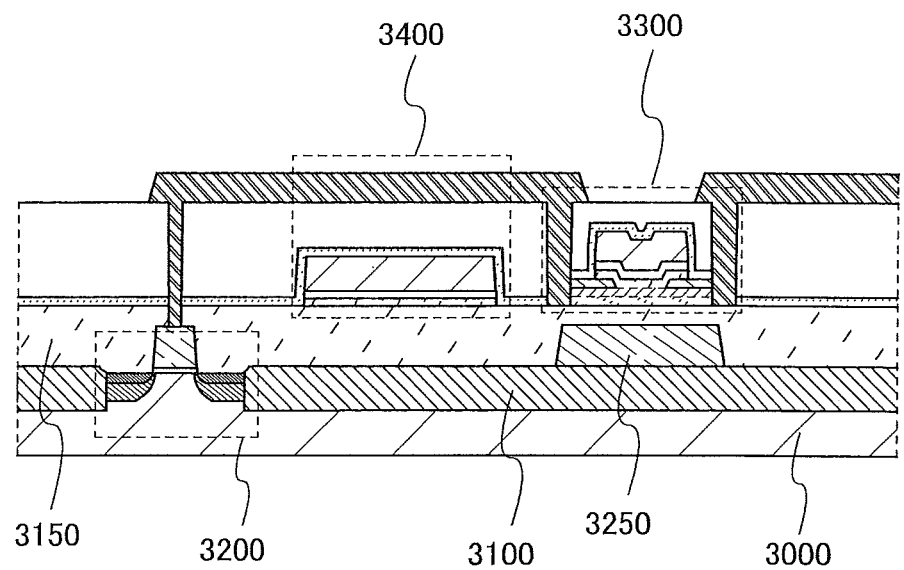
FIGS. 11A and 11B are a cross-sectional view and a circuit diagram of a semiconductor device.
Figure 11B:
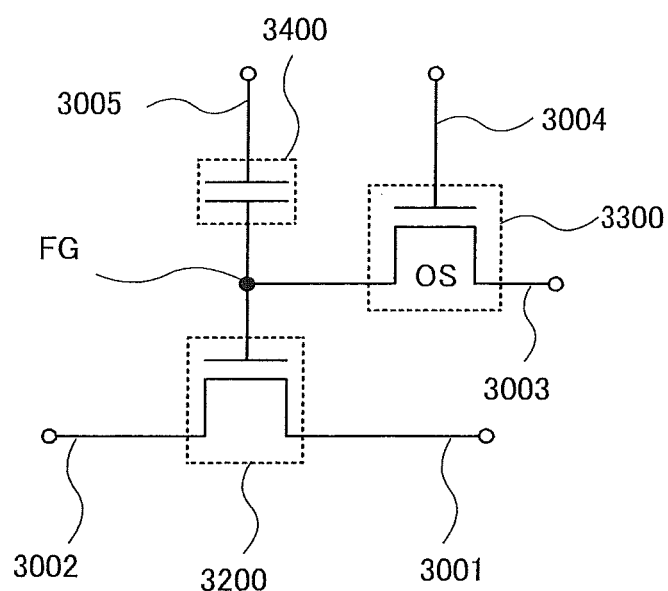

FIG. 11A is a cross-sectional view of the semiconductor device, and FIG. 11B is a circuit diagram of the semiconductor device.

The semiconductor device illustrated in FIGS. 11A and 11B includes a transistor 3200 including a first semiconductor material in a lower portion, and a transistor 3300 including a second semiconductor material and a capacitor 3400 in an upper portion. Note that the transistor 100 described in Embodiment 1 can be used as the transistor 3300.

One electrode of the capacitor 3400 is formed using the same material as a wiring layer electrically connected to a source electrode layer or a drain electrode layer of the transistor 3300, the other electrode of the capacitor 3400 is formed using the same material as a gate electrode layer of the transistor 3300, and a dielectric of the capacitor 3400 is formed using the same material as the insulating layer 180 and the insulating layer 185 of the transistor 3300; thus, the capacitor 3400 can be formed at the same time as the transistor 3300.

Here, the first semiconductor material and the second semiconductor material preferably have different energy gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be retained for a long time owing to its electrical characteristics, that is, the low off-state current.

Although both of the above transistors are n-channel transistors in the following description, it is needless to say that p-channel transistors can be used. The specific structure of the semiconductor device, such as a material used for the semiconductor device and the structure of the semiconductor device, needs not to be limited to that described here except for the use of the transistor described in Embodiment 1, which is formed using an oxide semiconductor for retaining data.

The transistor 3200 in FIG. 11A includes a channel formation region provided in a substrate 3000 containing a semiconductor material (such as crystalline silicon), impurity regions provided such that the channel formation region is provided therebetween, intermetallic compound regions in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

An element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

In the case where the transistor 3200 is formed using a crystalline silicon substrate, for example, the transistor 3200 can operate at high speed. Thus, when the transistor is used as a reading transistor, data can be read at high speed.

The transistor 3300 is provided over the insulating layer 3150, and the wiring layer electrically connected to the source electrode layer or the drain electrode layer of the transistor 3300 serves as the one electrode of the capacitor 3400. Further, the one electrode of the capacitor 3400 is electrically connected to the gate electrode layer of the transistor 3200.

The transistor 3300 in FIG. 11A is a top-gate transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor storage device can be extremely low, which leads to a sufficient reduction in power consumption.

Further, an electrode 3250 is provided so as to overlap with the transistor 3300 with the insulating layer 3150 provided therebetween. By supplying an appropriate potential to the electrode 3250 to be used as a second gate electrode, the threshold voltage of the transistor 3300 can be controlled. In addition, long-term reliability of the transistor 3300 can be improved. When the electrode operates with the same potential as that of the gate electrode of the transistor 3300, on-state current can be increased. Note that the electrode 3250 is not necessarily provided.

The transistor 3300 and the capacitor 3400 can be formed over the substrate over which the transistor 3200 is formed as illustrated in FIG. 11A, which enables the degree of the integration of the semiconductor device to be increased.

An example of a circuit configuration of the semiconductor device in FIG. 11A is illustrated in FIG. 11B.

In FIG. 11B, a first wiring 3001 is electrically connected to a source electrode layer of the transistor 3200. A second wiring 3002 is electrically connected to a drain electrode layer of the transistor 3200. A third wiring 3003 is electrically connected to one of the source electrode layer and the drain electrode layer of the transistor 3300. A fourth wiring 3004 is electrically connected to the gate electrode layer of the transistor 3300. The gate electrode layer of the transistor 3200 and the other of the source electrode layer and the drain electrode layer of the transistor 3300 are electrically connected to the one electrode of the capacitor 3400. A fifth wiring 3005 is electrically connected to the other electrode of the capacitor 3400. Note that a component corresponding to the electrode 3250 is not illustrated.

The semiconductor device in FIG. 11B utilizes a feature that the potential of the gate electrode layer of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode layer of the transistor 3200 and the capacitor 3400. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode layer of the transistor 3200 is retained (retaining).

Since the off-state current of the transistor 3300 is extremely low, the charge of the gate electrode layer of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode layer of the transistor 3200. This is because in general, in the case of using an n-channel transistor as the transistor 3200, an apparent threshold voltage $V_{th\_H}$ at the time when the high-level charge is given to the gate electrode layer of the transistor 3200 is lower than an apparent threshold voltage $V_{th\_L}$ at the time when the low-level charge is given to the gate electrode layer of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode layer of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($V_{th\_L}$), the transistor 3200 remains off. Thus, the data retained in the gate electrode layer can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode layer, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly-integrated semiconductor device having high electrical characteristics can be provided.

This embodiment can be combined as appropriate with any of the other embodiments and an example in this specification.

Embodiment 4

In this embodiment, a semiconductor device including the transistor of one embodiment of the present invention, which can retain stored data even when not powered, which does not have a limit on the number of write cycles, and which has a structure different from that described in Embodiment 3, is described.

Figure 12:
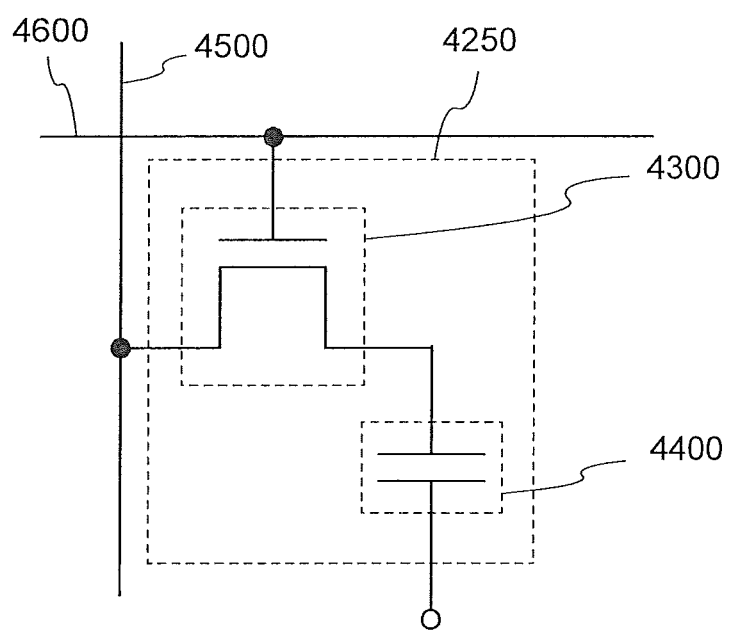
FIG. 12 is a circuit diagram of a semiconductor device.

FIG. 12 illustrates an example of a circuit configuration of the semiconductor device. In the semiconductor device, a first wiring 4500 is electrically connected to a source electrode layer of a transistor 4300, a second wiring 4600 is electrically connected to a gate electrode layer of the transistor 4300, and a drain electrode layer of the transistor 4300 is electrically connected to a first terminal of a capacitor 4400. Note that the transistor 100 described in Embodiment 1 can be used as the transistor 4300 included in the semiconductor device. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 11A and 11B. Thus, the capacitor 4400 can be formed through the same process and at the same time as the transistor 4300 in a manner similar to that of the capacitor 3400 described in Embodiment 3.

Next, writing and retaining of data in the semiconductor device (the memory cell 4250) illustrated in FIG. 12 are described.

First, a potential at which the transistor 4300 is turned on is supplied to the second wiring 4600, so that the transistor 4300 is turned on. Accordingly, the potential of the first wiring 4500 is supplied to the first terminal of the capacitor 4400 (writing). After that, the potential of the second wiring 4600 is set to a potential at which the transistor 4300 is turned off, so that the transistor 4300 is turned off Thus, the potential of the first terminal of the capacitor 4400 is retained (retaining).

The transistor 4300 including an oxide semiconductor has an extremely low off-state current. For that reason, the potential of the first terminal of the capacitor 4400 (or a charge accumulated in the capacitor 4400) can be retained for an extremely long time by turning off the transistor 4300.

Next, reading of data is described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the first terminal of the capacitor 4400 (or the charge accumulated in the capacitor 4400).

For example, the potential of the first wiring 4500 after the charge redistribution is $(C_B \times V_{B0} + C \times V)/(C_B + C)$, where V is the potential of the first terminal of the capacitor 4400, C is the capacitance of the capacitor 4400, $C_B$ is the capacitance component of the first wiring 4500, and $V_{B0}$ is the potential of the first wiring 4500 before the charge redistribution. Thus, it can be found that, assuming that the memory cell 4250 is in either of two states in which the potential of the first terminal of the capacitor 4400 is $V_1$ and $V_0$ ($V_1 > V_0$), the potential of the first wiring 4500 in the case of retaining the potential $V_1$ ($=(C_B \times V_{B0} + C \times V_1)/(C_B + C)$) is higher than the potential of the first wiring 4500 in the case of retaining the potential $V_0$ ($=(C_B \times V_{B0} + C \times V_0)/(C_B + C)$).

Then, by comparing the potential of the first wiring 4500 with a predetermined potential, data can be read.

As described above, the semiconductor device (the memory cell 4250) illustrated in FIG. 12 can retain charge that is accumulated in the capacitor 4400 for a long time because the off-state current of the transistor 4300 is extremely low. In other words, refresh operation becomes unnecessary or the frequency of the refresh operation can be extremely low, which leads to a sufficient reduction in power consumption. Moreover, stored data can be retained for a long time even when power is not supplied.

A substrate over which a driver circuit for the memory cell 4250 is formed and the memory cell 4250 illustrated in FIG. 12 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, or gallium arsenide can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly-integrated semiconductor device having high electrical characteristics can be provided.

This embodiment can be combined as appropriate with any of the other embodiments and an example in this specification.

Embodiment 5

The transistor described in Embodiment 1 can be used in a semiconductor device such as a display device, a storage device, a CPU, a digital signal processor (DSP), an LSI such as a custom LSI or a programmable logic device (PLD), or a radio frequency identification (RF-ID). In this embodiment, electronic devices each including the semiconductor device will be described.

Examples of the electronic devices having the semiconductor devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples of the electronic devices also include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 13A to 13C.

Figure 13A:
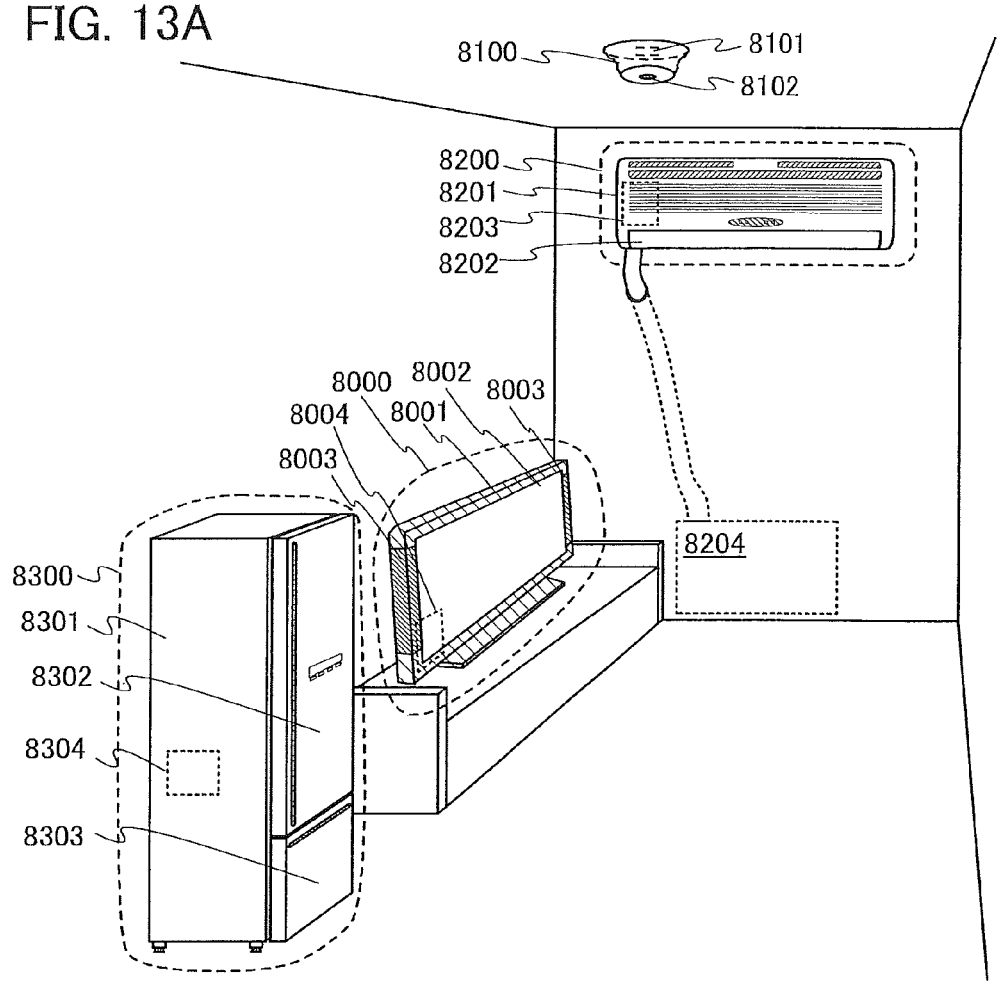
FIGS. 13A to 13C illustrate electronic devices to which semiconductor devices can be applied.
Figure 13B:
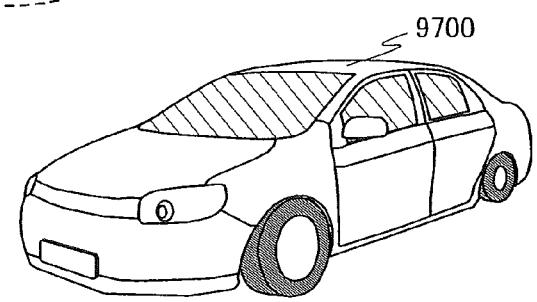
Figure 13C:
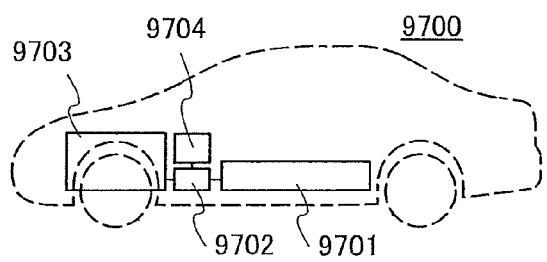

In a television set 8000 illustrated in FIG. 13A, a display portion 8002 is incorporated in a housing 8001. The display portion 8002 can display an image and a speaker portion 8003 can output sound. A storage device including the transistor of one embodiment of the present invention can be used for a driver circuit for operating the display portion 8002.

The television set 8000 may also include a CPU 8004 for performing information communication or a memory. For the CPU 8004 and the memory, a CPU or a storage device including the transistor of one embodiment of the present invention can be used.

An alarm device 8100 illustrated in FIG. 13A is a residential fire alarm, which is an example of an electronic device including a sensor portion 8102 for smoke or heat and a microcomputer 8101. Note that the microcomputer 8101 includes a storage device or a CPU including the transistor of one embodiment of the present invention.

An air conditioner which includes an indoor unit 8200 and an outdoor unit 8204 illustrated in FIG. 13A is an example of an electronic device including the transistor, the storage device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 13A, the CPU 8203 may be provided in the outdoor unit 8204. Alternatively, the CPU 8203 may be provided in both the indoor unit 8200 and the outdoor unit 8204. By using any of the transistors of one embodiment of the present invention for the CPU in the air conditioner, a reduction in power consumption of the air conditioner can be achieved.

An electric refrigerator-freezer 8300 illustrated in FIG. 13A is an example of an electronic device including the transistor, the storage device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 13A, the CPU 8304 is provided in the housing 8301. When the transistor of one embodiment of the present invention is used for the CPU 8304 of the electric refrigerator-freezer 8300, a reduction in power consumption of the electric refrigerator-freezer 8300 can be achieved.

FIGS. 13B and 13C illustrate an example of an electric vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When the transistor of one embodiment of the present invention is used for the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments and an example in this specification.

EXAMPLE

In this example, the electrical characteristics of a transistor of one embodiment of the present invention are described.

First, a method for manufacturing a transistor is described. The transistor in this example has the structure illustrated in FIGS. 15A and 15B.

As a substrate, a glass substrate was used, and a silicon oxynitride film was formed over the glass substrate by a plasma CVD method.

Next, a first oxide semiconductor film with a thickness of approximately 10 nm and a second oxide semiconductor film with a thickness of approximately 40 nm were formed in this order over the silicon oxynitride film by a sputtering method. Note that an IGZO film having a composition ratio of In:Ga:Zn=1:3:2 and an IGZO film having a composition ratio of In:Ga:Zn=1:1:1 or In:Ga:Zn=3:1:2 were used as the first oxide semiconductor film and the second oxide semiconductor film, respectively.

Next, a 15-nm-thick tungsten film and an organic resin were formed over the second oxide semiconductor film, a negative resist film was formed, exposure was performed on the resist film by scanning with an electron beam, and development treatment was performed, so that a first resist mask was formed.

Then, by using the first resist mask, the organic resin and the tungsten film were selectively etched. A dry etching apparatus using inductively coupled plasma (ICP) was used for the etching.

Next, the first resist mask and the organic resin were removed by ashing. Then, the first oxide semiconductor film and the second oxide semiconductor film were selectively etched using the tungsten film as a mask, so that a stack of a first oxide semiconductor layer, a second oxide semiconductor layer, and the tungsten film was formed.

Next, a second resist mask was formed over the tungsten film, and the tungsten film was selectively etched using the second resist mask, so that a source electrode layer and a drain electrode layer were formed.

Next, a 5-nm-thick third oxide semiconductor film was formed over the oxide semiconductor layers, the source electrode layer, and the drain electrode layer by a sputtering method. Note that an IGZO film having a composition ratio of In:Ga:Zn 1:3:2 was used as the third oxide semiconductor film.

Next, a 10-nm-thick silicon oxynitride film to be a gate insulating film was formed over the third oxide semiconductor film by a plasma CVD method.

Next, a 10-nm-thick titanium nitride film and a 10-nm-thick tungsten film were successively formed by a sputtering method. After that, a third resist mask was formed over the tungsten film.

Next, the titanium nitride film and the tungsten film were selectively etched using the third resist mask, so that a gate electrode layer was formed.

Next, a fourth resist mask was formed over the gate electrode layer and the gate insulating film, and the gate insulating film and the third oxide semiconductor film were selectively etched using the fourth resist mask, so that the gate insulating film and a third oxide semiconductor layer having shapes illustrated in FIGS. 15A and 15B were formed.

Next, an aluminum oxide film and a silicon oxynitride film were formed as insulating layers.

Through the above process, the transistor of one embodiment of the present invention (corresponding to the model (b) illustrated in FIG. 16B) was fabricated.

Further, a transistor having a conventional structure (corresponding to the model (a) illustrated in FIG. 16A) was also fabricated by changing part of the above process.

Next, electrical characteristics of the fabricated transistors are described.

Figure 17A:
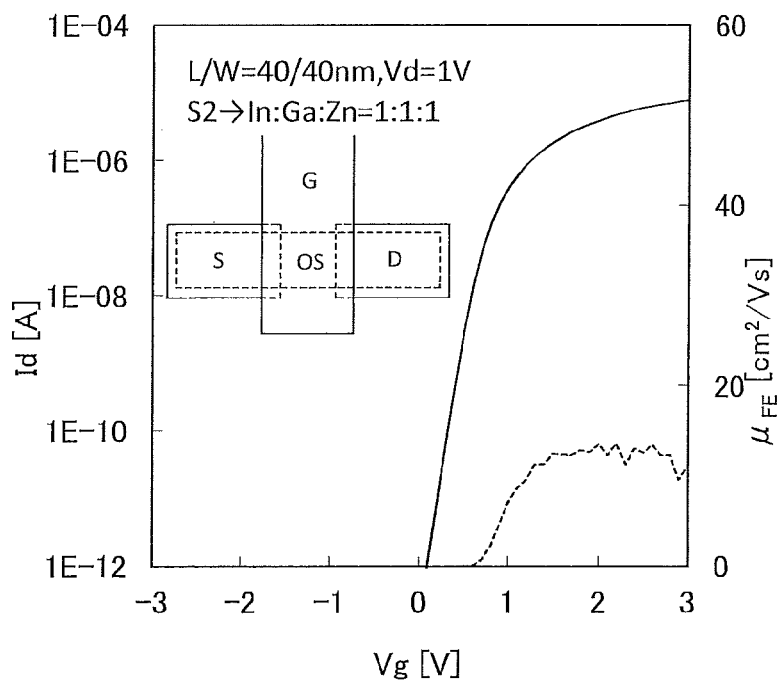
FIGS. 17A and 17B show Id-Vg characteristics of a transistor.

FIG. 17A shows Id-Vg characteristics of the transistor having the conventional structure. The composition ratio of the second oxide semiconductor layer of the transistor was In:Ga:Zn=1:1:1. The field-effect mobility of the transistor was approximately 14 $cm^2$/Vs and the S value thereof was approximately 105 mV/decade; thus, favorable characteristics were obtained.

Figure 17B:
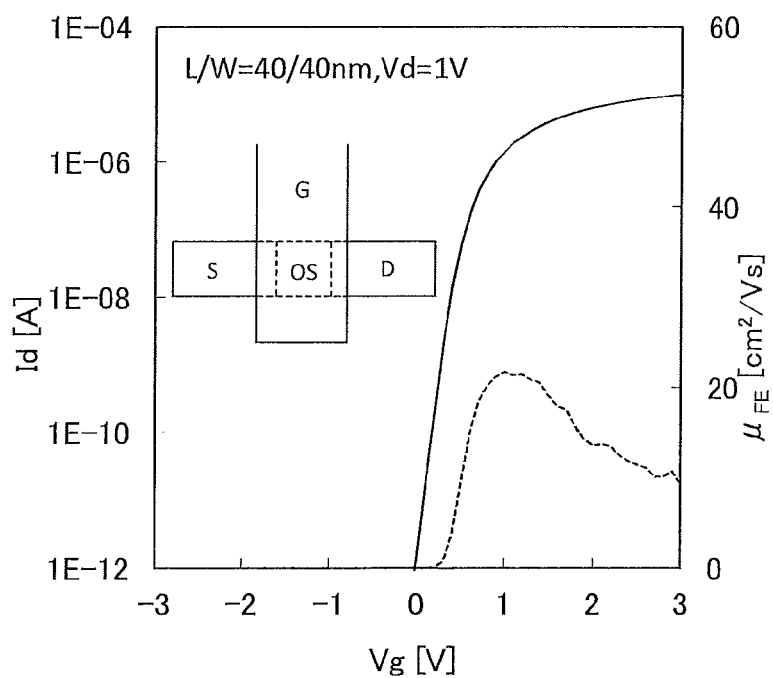

FIG. 17B shows Id-Vg characteristics of the transistor of one embodiment of the present invention. The composition ratio of the second oxide semiconductor layer of the transistor was In:Ga:Zn=3:1:2. The field-effect mobility of the transistor was approximately 21 $cm^2$/Vs and the S value thereof was approximately 90 mV/decade; thus, the obtained characteristics were more favorable than those of the transistor having the conventional structure.

Here, in the case where the composition ratio of the second oxide semiconductor layer used in the transistor having the conventional structure was In:Ga:Zn=3:1:2, a field-effect mobility of approximately 100 $cm^2$Ns was obtained; however, favorable characteristics were not obtained (e.g., the threshold voltage was largely shifted in the negative direction). Further, in the case where the composition ratio of the second oxide semiconductor layer used in the transistor of one embodiment of the present invention was In:Ga:Zn=1:1:1, an on-state current and a field-effect mobility were lower than those in Id-Vg characteristics in FIG. 17A.

In other words, it is found that when an appropriate material is selected for the oxide semiconductor layer, the transistor of one embodiment of the present invention can have more favorable electrical characteristics than the transistor having the conventional structure.

Note that this example can be combined with any of the embodiments in this specification as appropriate.

EXPLANATION OF REFERENCE

100: transistor, 110: substrate, 120: base insulating film, 130: oxide semiconductor layer, 131: first oxide semiconductor layer, 132: second oxide semiconductor layer, 133: third oxide semiconductor layer, 135: boundary, 137: channel region, 140: source electrode layer, 145: wiring, 147: first opening, 150: drain electrode layer, 155: wiring, 157: second opening, 160: gate insulating film, 170: gate electrode layer, 172: conductive film, 175: wiring, 177: third opening, 180: insulating layer, 185: insulating layer, 331: first oxide semiconductor film, 332: second oxide semiconductor film, 333: third oxide semiconductor film, 340: first conductive film, 341: first conductive layer, 360: insulating film, 370: second conductive film, 400: resist mask, 3000: substrate, 3001: wiring, 3002: wiring, 3003: wiring, 3004: wiring, 3005: wiring, 3100: element isolation insulating layer, 3150: insulating layer, 3200: transistor, 3250: electrode, 3300: transistor, 3400: capacitor, 4250: memory cell, 4300: transistor, 4400: capacitor, 4500: wiring, 4600: wiring, 8000: television set, 8001: housing, 8002: display portion, 8003: speaker portion, 8004: CPU, 8100: alarm device, 8101: microcomputer, 8102: sensor portion, 8200: indoor unit, 8201: housing, 8202: air outlet, 8203: CPU, 8204: outdoor unit, 8300: electric refrigerator-freezer, 8301: housing, 8302: door for refrigerator, 8303: door for freezer, 8304: CPU, 9700: electric vehicle, 9701: secondary battery, 9702: circuit, 9703: driving device, and 9704: processing unit.

This application is based on Japanese Patent Application serial no. 2013-099534 filed with Japan Patent Office on May 9, 2013, the entire contents of which are hereby incorporated by reference.

The invention claimed is:

1. A semiconductor device comprising:
a first oxide semiconductor layer;
a source electrode layer over the first oxide semiconductor layer, the source electrode layer including:
a first tapered side surface; and
a second side surface aligned with a first edge of the first oxide semiconductor layer;
a drain electrode layer over the first oxide semiconductor layer, the drain electrode layer including:
a third tapered side surface; and
a fourth side surface aligned with a second edge of the first oxide semiconductor layer;
a second oxide semiconductor layer over the first oxide semiconductor layer;
a third oxide semiconductor layer under the first oxide semiconductor layer;
a first insulating layer over the second oxide semiconductor layer;
a gate electrode layer over the first insulating layer, the gate electrode layer overlapping the first tapered side surface and the third tapered side surface; and
a second insulating layer over the gate electrode layer, the second insulating layer including oxygen and aluminum,
wherein the source electrode layer is in direct contact with a first part of a top surface of the first oxide semiconductor layer,
wherein the source electrode layer is not in direct contact with any side surface of the first oxide semiconductor layer,
wherein the drain electrode layer is in direct contact with a second part of the top surface of the first oxide semiconductor layer,
wherein the drain electrode layer is not in direct contact with any side surface of the first oxide semiconductor layer,
wherein each of the source electrode layer and the drain electrode layer includes a metal nitride,
wherein the second oxide semiconductor layer is in direct contact with a part of a top surface of the source electrode layer and a part of a top surface of the drain electrode layer,
wherein energy of a conduction band minimum of the second oxide semiconductor layer is closer to a vacuum level than energy of a conduction band minimum of the first oxide semiconductor layer by greater than or equal to 0.05 eV and less than or equal to 2 eV, and
wherein energy of a conduction band minimum of the third oxide semiconductor layer is closer to a vacuum level than the energy of the conduction band minimum of the first oxide semiconductor layer by greater than or equal to 0.05 eV and less than or equal to 2 eV.

2. The semiconductor device according to claim 1, wherein the first oxide semiconductor layer, the second oxide semiconductor layer, and the third oxide semiconductor layer are each an In-M-Zn oxide,
wherein M is one of Al, Ti, Ga, Y, Zr, La, Ce, Nd, and Hf, and
wherein an atomic ratio of M to In in each of the second oxide semiconductor layer and the third oxide semiconductor layer is higher than an atomic ratio of M to In in the first oxide semiconductor layer.

3. The semiconductor device according to claim 1, wherein the first oxide semiconductor layer, the second oxide semiconductor layer, and the third oxide semiconductor layer each include crystals in which c-axes are aligned.

4. The semiconductor device according to claim 1, wherein the metal nitride is one of tantalum nitride and titanium nitride.

5. An electronic device comprising the semiconductor device according to claim 1.

6. A semiconductor device comprising:
a first oxide semiconductor layer;
a source electrode layer over the first oxide semiconductor layer, the source electrode layer including:
a first tapered side surface; and
a second side surface aligned with a first edge of the first oxide semiconductor layer;
a drain electrode layer over the first oxide semiconductor layer, the drain electrode layer including:
a third tapered side surface; and
a fourth side surface aligned with a second edge of the first oxide semiconductor layer;
a second oxide semiconductor layer over the first oxide semiconductor layer; and
a third oxide semiconductor layer under the first oxide semiconductor layer;
a first insulating layer over the second oxide semiconductor layer;
a gate electrode layer over the first insulating layer, the gate electrode layer overlapping the first tapered side surface and the third tapered side surface; and
a second insulating layer over the gate electrode layer, the second insulating layer including oxygen and aluminum,
wherein the source electrode layer is in direct contact with a first part of a top surface of the first oxide semiconductor layer,
wherein the source electrode layer is not in direct contact with any side surface of the first oxide semiconductor layer,
wherein the drain electrode layer is in direct contact with a second part of the top surface of the first oxide semiconductor layer,
wherein the drain electrode layer is not in direct contact with any side surface of the first oxide semiconductor layer,
wherein each of the source electrode layer and the drain electrode layer includes a metal nitride,
wherein the second oxide semiconductor layer is in direct contact with a part of a top surface of the source electrode layer and a part of a top surface of the drain electrode layer,
wherein the first oxide semiconductor layer, the second oxide semiconductor layer, and the third oxide semiconductor layer are each an In-M-Zn oxide,
wherein M is one of Al, Ti, Ga, Y, Zr, La, Ce, Nd, and Hf, and
wherein an atomic ratio of M to In in each of the second oxide semiconductor layer and the third oxide semiconductor layer is higher than an atomic ratio of M to In in the first oxide semiconductor layer.

7. The semiconductor device according to claim 6, wherein the first oxide semiconductor layer, the second oxide semiconductor layer, and the third oxide semiconductor layer each include crystals in which c-axes are aligned.

8. The semiconductor device according to claim 6, wherein the metal nitride is one of tantalum nitride and titanium nitride.

9. An electronic device comprising the semiconductor device according to claim 6.

* * * * *